(12) United States Patent
Irie et al.

(10) Patent No.: US 9,372,403 B2
(45) Date of Patent: Jun. 21, 2016

(54) CHEMICALLY AMPLIFIED PHOTOSENSITIVE RESIN COMPOSITION AND METHOD FOR PRODUCING RESIST PATTERN USING THE SAME

(71) Applicant: Tokyo Ohka Kogyo Co., Ltd., Kawasaki-shi (JP)

(72) Inventors: Makiko Irie, Kawasaki (JP); Shota Katayama, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/451,112

(22) Filed: Aug. 4, 2014

(65) Prior Publication Data
US 2015/0044613 A1 Feb. 12, 2015

(30) Foreign Application Priority Data

Aug. 9, 2013 (JP) ................................. 2013-166530

(51) Int. Cl.
*G03F 7/039* (2006.01)
*G03F 7/20* (2006.01)
*G03F 7/30* (2006.01)
*G03F 7/027* (2006.01)

(52) U.S. Cl.
CPC .............. *G03F 7/0397* (2013.01); *G03F 7/027* (2013.01); *G03F 7/30* (2013.01)

(58) Field of Classification Search
CPC ....... G03F 7/004; G03F 7/038; G03F 7/0382; G03F 7/039; G03F 7/0392; G03F 7/0395
See application file for complete search history.

(56) References Cited

U.S. PATENT DOCUMENTS

| | | | | |
|---|---|---|---|---|
| 5,688,628 | A * | 11/1997 | Oie et al. ....................... | 430/176 |
| 6,251,571 | B1 * | 6/2001 | Dessauer et al. .............. | 430/343 |
| 2004/0110084 | A1 * | 6/2004 | Inomata et al. ............. | 430/270.1 |
| 2006/0040206 | A1 * | 2/2006 | Nakashima et al. ....... | 430/270.1 |
| 2010/0047715 | A1 * | 2/2010 | Washio et al. ............. | 430/286.1 |
| 2011/0025973 | A1 * | 2/2011 | Kaneiwa et al. .............. | 349/193 |
| 2012/0184100 | A1 | 7/2012 | Yasuda et al. | |
| 2014/0087136 | A1 * | 3/2014 | Osaku ........................... | 428/141 |

FOREIGN PATENT DOCUMENTS

| | | |
|---|---|---|
| JP | 2012-163949 | 8/2012 |
| WO | WO 2012/165448 | * 12/2012 |

* cited by examiner

*Primary Examiner* — Anca Eoff
(74) *Attorney, Agent, or Firm* — Knobbe Martens Olson & Bear LLP

(57) ABSTRACT

A chemically amplified photosensitive resin composition including a compound represented by formula (1) and/or formula (4), a resin having an acid-dissociative dissolution-controlling group whose solubility in alkali increases under the action of an acid or an alkali-soluble resin, a photoacid generator, and an organic solvent, in which the solid concentration is 40% by mass to 65% by mass. $R^1$, $R^2$, and $R^3$ independently represent a hydrogen atom or an alkyl group, $R^4$ represents a group represented by formula (2) or (3), and $R^5$ and $R^6$ represent a monovalent hydrocarbon group which may have a substituent.

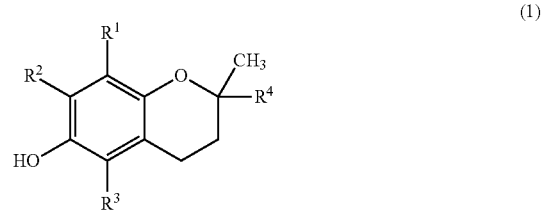

(1)

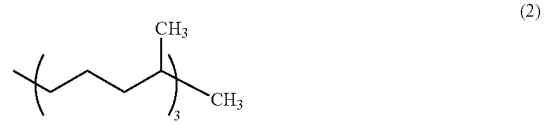

(2)

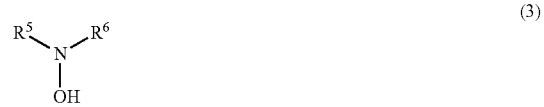

(3)

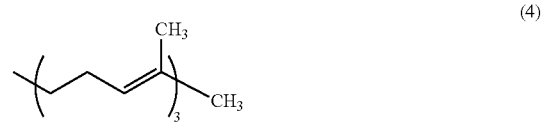

(4)

7 Claims, No Drawings

CHEMICALLY AMPLIFIED PHOTOSENSITIVE RESIN COMPOSITION AND METHOD FOR PRODUCING RESIST PATTERN USING THE SAME

CROSS-REFERENCE TO RELATED APPLICATIONS

This application claims priority to Japanese Patent Application No. 2013-166530, filed Aug. 9, 2013, the content of which is incorporated herein by reference.

BACKGROUND OF THE INVENTION

1. Field of the Invention

The present invention relates to a chemically amplified photosensitive resin composition and a method for producing a resist pattern using the chemically amplified photosensitive resin composition.

2. Background Art

In recent years, high density packaging technologies have progressed in semiconductor packages along with downsizing electronics devices, and the increase in package density has been developed on the basis of mounting multi-pin thin film in packages, miniaturizing of package size, two-dimensional packaging technologies in flip-tip systems or three-dimensional packaging technologies. In these types of high density packaging techniques, connecting terminals, including protruding electrodes (mounting terminals) such as bumps that protrude above the package, or metal posts or the like that connect rewiring extending from peripheral terminals on the wafer with the mounting terminals, are disposed on the surface of the substrate with high precision.

As a method for forming the protruding electrodes or metal posts as described above, a method in which a thick film, for example, a film having a film thickness of 30 μm or more is formed on a surface to be processed on a substrate by spin coating, and then a predetermined portion in the film is selectively removed to pattern the film, and a conductor such as copper is embedded into an area in the film from which the film is removed by plating, and then the surrounding film is removed is known. As a composition for forming such a thick film having a large film thickness on a substrate, a chemically amplified photosensitive resin composition for a thick film, including at least a resin solubilized in alkali under the action of an acid, and an acid generator has been known (see, for example, Japanese Unexamined Patent Application, Publication No. 2012-163949).

SUMMARY OF THE INVENTION

In order to form a thick film, a chemically amplified photosensitive resin composition is usually used at a high solid content concentration, for example, 40% by mass or more. According to the investigation of the present inventors, it has been demonstrated that a chemically amplified photosensitive resin composition for a thick film having such a high solid concentration has deterioration of photographic characteristics over time.

The present invention has been made taking this situation into consideration, and has an object to provide a chemically amplified photosensitive resin composition for a thick film, having suppressed deterioration of photographic characteristics over time, and a method for producing a resist pattern using the same.

The present inventors have conducted intensive studies in order to achieve the object, and as a result, the present inventors have found that the problems described above can be solved by adding predetermined tocopherols and/or a hydroxylamine compound to a chemically amplified photosensitive resin composition for a thick film, thereby completing the present invention. Specifically, the present invention provides the following.

A first aspect of the present invention is a chemically amplified photosensitive resin composition, containing a compound represented by the following formula (1) and/or a compound represented by the following formula (4), a resin having an acid-dissociative dissolution-controlling group and whose solubility in alkali increases under the action of an acid or an alkali-soluble resin, a photoacid generator, and an organic solvent, in which the solid concentration is 40% by mass to 65% by mass.

[Chemical formula 1]

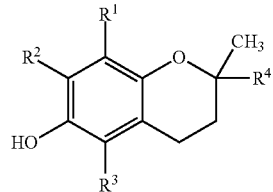

(1)

In the formula, $R^1$, $R^2$, and $R^3$ independently represent a hydrogen atom or an alkyl group. $R^4$ represents a group represented by the following formula (2) or (3).

[Chemical formula 2]

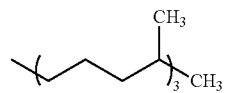

(2)

(3)

[Chemical formula 3]

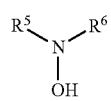

(4)

In the formula, $R^5$ and $R^6$ represent a monovalent hydrocarbon group which may have a substituent.

A second aspect of the present invention is a method for producing a resist pattern, including a photosensitive resin layer-forming step of forming a photosensitive resin layer containing the chemically amplified photosensitive resin composition on a substrate, an exposure step of selectively exposing the photosensitive resin layer, and a developing step of developing the exposed photosensitive resin layer.

According to the present invention, a chemically amplified photosensitive resin composition for a thick film, having suppressed deterioration of photographic characteristics over time, and a method for producing a resist pattern using the same can be provided.

DETAILED DESCRIPTION OF THE PREFERRED EMBODIMENTS

Chemically Amplified Photosensitive Resin Composition

The chemically amplified photosensitive resin composition according to the present invention at least contains the compound represented by the formula (1) and/or the compound represented by the formula (4), a resin having an acid-dissociative dissolution-controlling group and whose solubility in alkali increases under the action of an acid or an alkali-soluble resin, a photoacid generator, and an organic solvent, in which the solid concentration is 40% by mass to 65% by mass. This chemically amplified photosensitive resin composition is suitably used in the formation of connecting terminals such as bumps and metal posts in the production of circuit boards and electronic components such as CSPs (chip-size packages) that are mounted on circuit boards, and the formation of a wiring pattern and the like. This chemically amplified photosensitive resin composition may be either a positive-type one or a negative-type one. Hereinafter, the respective components contained in the chemically amplified positive-type photosensitive resin composition and the chemically amplified negative-type photosensitive resin composition will be described in detail.

Chemically Amplified Positive-Type Photosensitive Resin Composition

The chemically amplified positive-type photosensitive resin composition contains at least a compound represented by the formula (1) and/or a compound represented by the formula (4) (hereinafter also referred to as a "component (A)"), a resin having an acid-dissociative dissolution-controlling group and whose solubility in alkali increases under the action of an acid (hereinafter also referred to as a "component (B1)"), a photoacid generator (hereinafter also referred to as a "component (C)"), and an organic solvent (hereinafter also referred to as a "component (S)"), in which the solid concentration is 40% by mass to 65% by mass. The chemically amplified positive-type photosensitive resin composition is alkali-insoluble before exposure, but if acids are generated from the component (C) by exposure, the acid-dissociative dissolution-controlling groups are dissociated under the action of an acid, and the chemically amplified positive-type photosensitive resin composition is changed to be alkali-soluble. As a result, in the production of a resist pattern, if a photosensitive resin layer obtained by coating the chemically amplified positive-type photosensitive resin composition on a substrate is selectively exposed, an exposed area is changed to be alkali-soluble, while an unexposed area is not changed and is still alkali-insoluble, and therefore, can be developed in alkali.

Compound (A) Represented by Formula (1) and/or Represented by Formula (4)

The chemically amplified photosensitive resin composition according to the present invention has suppressed deterioration of photographic characteristics over time by incorporating the compound (A) represented by the formula (1) and/or represented by the formula (4) therein. The components (A) may be used singly or in combination of two or more kinds thereof.

In the formula (1), examples of the alkyl group represented by $R^1$, $R^2$, or $R^3$ include an alkyl group having 1 to 6 carbon atoms, such as a methyl group, an ethyl group, a propyl group, an isopropyl group, a butyl group, an isobutyl group, a sec-butyl group, a tert-butyl group, a pentyl group, and a hexyl group, and preferably an alkyl group having 1 to 4 carbon atoms, and among these, a methyl group is preferred.

In the formula (4), examples of $R^5$ and $R^6$ include an alkyl group, a cycloalkyl group, an alkenyl group, an aryl group, and an aralkyl group, and among these, an alkyl group and an aralkyl group are preferred. Examples of the substituent which the monovalent hydrocarbon group represented by $R^5$ and $R^6$ may have include halogen atoms (a fluorine atom, a chlorine atom, a bromine atom, and an iodine atom), and a hydroxyl group. Specific examples of $R^5$ and $R^6$ include an alkyl group having 1 to 30 carbon atoms, and preferably 1 to 20 carbon atoms, such as a methyl group, an ethyl group, a propyl group, an isopropyl group, a butyl group, an isobutyl group, a sec-butyl group, a tert-butyl group, a pentyl group, a hexyl group, an octyl group, a decyl group, a dodecyl group, an octadecyl group, and an eicosyl group; an cycloalkyl group having 3 to 20 carbon atoms, and preferably 3 to 6 carbon atoms, such as a cyclopentyl group and a cyclohexyl group; an alkenyl group having 2 to 20 carbon atoms, and preferably 2 to 6 carbon atoms, such as a vinyl group and an allyl group; an aryl group having 6 to 20 carbon atoms, and preferably 6 to 12 carbon atoms, such as a phenyl group, a tolyl group, and a naphthyl group; and an aralkyl group having 7 to 20 carbon atoms, and preferably 7 to 13 carbon atoms, such as a benzyl group and a phenethyl group, and among these, a benzyl group is preferred.

Specific examples of the compound represented by the formula (1) include α-tocopherol, β-tocopherol, γ-tocopherol, δ-tocopherol, α-tocotrienol, β-tocotrienol, γ-tocotrienol, and δ-tocotrienol, and among these, α-tocopherol is preferred. Further, in the case where the compound represented by the formula (1) has an optical isomer, it may be either an L-form or a D-form, or a mixture thereof.

Specific examples of the compound represented by the formula (4) include N,N-diethylhydroxylamine, N,N-dioctadecylhydroxylamine, and N,N-dibenzylhydroxylamine, and among these, N,N-dibenzylhydroxylamine is preferred.

The content of the component (A) is preferably in the range of 0.01 part by mass to 0.2 part by mass, and more preferably in the range of 0.02 part by mass to 0.1 part by mass, with respect to 100 parts by mass of the resin solid content (in particular, the component (B1) as described later, or in the case where the chemically amplified positive-type photosensitive resin composition includes the component (D) as described later, a combination of the component (B1) and the component (D)). Alternatively, the content of the component (A) is preferably 0.010% by mass to 0.15% by mass, and more preferably 0.015% by mass to 0.10% by mass, with respect to the total mass of the chemically amplified positive-type photosensitive resin composition. Within the range above, the photographic characteristics of the chemically amplified positive-type photosensitive resin composition can be effectively suppressed from being deteriorated over time.

Resin Having Acid-Dissociative Dissolution-Controlling Group and Whose Solubility in Alkali Increases Under Action of Acid (B1)

The resin having an acid-dissociative dissolution-controlling group and whose solubility in alkali increases under the action of an acid (B1) has been selected from various resins blended into the photosensitive resin composition in the related art. The components (B1) may be used singly or in combination of two or more kinds thereof. Suitable examples of the component (B1) include a novolak resin (B1-1), a polyhydroxystyrene resin (B1-2), and an acrylic resin (B1-3), having the following specific structures. Hereinafter, the novolak resin (B1-1), the polyhydroxystyrene resin (B1-2), and the acrylic resin (B1-3) will be described in order.

Novolak Resin (B1-1)

As the novolak resin (B1-1), a resin including the structural unit represented by the following formula (b1) can be used.

[Chemical formula 4]

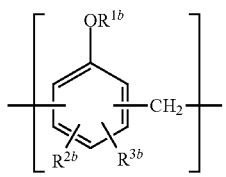

(b1)

In the formula (b1), $R^{1b}$ represents an acid-dissociative dissolution-controlling group; and $R^{2b}$ and $R^{3b}$ each independently represent a hydrogen atom or an alkyl group having 1 to 6 carbon atoms.

The acid-dissociative dissolution-controlling group represented by the $R^{1b}$ is preferably a group represented by the following formula (b2) or (b3), a linear, branched, or cyclic alkyl group having 1 to 6 carbon atoms, a vinyloxyethyl group, a tetrahydropyranyl group, a tetrafuranyl group, or a trialkylsilyl group.

[Chemical formula 5]

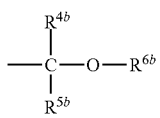

(b2)

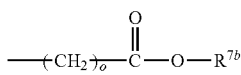

(b3)

In the formulae (b2) and (b3), $R^{4b}$ and $R^{5b}$ each independently represent a hydrogen atom, or a linear or branched alkyl group having 1 to 6 carbon atoms; $R^{6b}$ represents a linear, branched, or cyclic alkyl group having 1 to 10 carbon atoms; $R^{7b}$ represents a linear, branched, or cyclic alkyl group having 1 to 6 carbon atoms; and o represents 0 or 1.

Examples of the linear or branched alkyl group include a methyl group, an ethyl group, a propyl group, an isopropyl group, an n-butyl group, an isobutyl group, a tert-butyl group, a pentyl group, an isopentyl group, and a neopentyl group. Also, examples of the cyclic alkyl group include a cyclopentyl group and a cyclohexyl group.

Specific examples of the acid-dissociative dissolution-controlling group represented by the formula (b2) include a methoxyethyl group, an ethoxyethyl group, an n-propoxyethyl group, an isopropoxyethyl group, an n-butoxyethyl group, an isobutoxyethyl group, a tert-butoxyethyl group, a cyclohexyloxyethyl group, a methoxypropyl group, an ethoxypropyl group, a 1-methoxy-1-methyl-ethyl group, and a 1-ethoxy-1-methylethyl group. Further, specific examples of the acid-dissociative dissolution-controlling group represented by the formula (b3) include a tert-butoxycarbonyl group and a tert-butoxycarbonylmethyl group. Examples of the trialkylsilyl group include a trimethylsilyl group and a tri-tert-butyldimethylsilyl group, in which each alkyl group has 1 to 6 carbon atoms.

Polyhydroxystyrene Resin (B1-2)

As the polyhydroxystyrene resin (B1-2), a resin including the structural unit represented by the following formula (b4) can be used.

[Chemical formula 6]

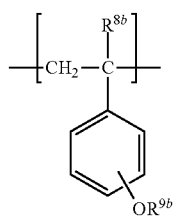

(b4)

In the formula (b4), $R^{8b}$ represents a hydrogen atom or an alkyl group having 1 to 6 carbon atoms; and $R^{9b}$ represents an acid-dissociative dissolution-controlling group.

The alkyl group having 1 to 6 carbon atoms may include, for example, linear, branched, or cyclic alkyl groups having 1 to 6 carbon atoms. Examples of the linear or branched alkyl group include a methyl group, an ethyl group, a propyl group, an isopropyl group, an n-butyl group, an isobutyl group, a tert-butyl group, a pentyl group, an isopentyl group, and a neopentyl group; and examples of the cyclic alkyl group include a cyclopentyl group and a cyclohexyl group.

The acid-dissociative dissolution-controlling group represented by the $R^{9b}$ may be similar to the acid-dissociative dissolution-controlling groups exemplified in terms of the formulae (b2) and (b3).

Furthermore, the polyhydroxystyrene resin (B1-2) may include another polymerizable compound as a structural unit in order to moderately control physical or chemical properties. Examples of the polymerizable compound include conventional radical polymerizable compounds and anion polymerizable compounds. Examples of the polymerizable compound include monocarboxylic acids such as acrylic acid, methacrylic acid, and crotonic acid; dicarboxylic acids such as maleic acid, fumaric acid, and itaconic acid; methacrylic acid derivatives having a carboxyl group and an ester bond, such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; alkyl (meth)acrylic esters such as methyl(meth)acrylate, ethyl (meth)acrylate, and butyl (meth)acrylate; hydroxyalkyl (meth)acrylic esters such as 2-hydroxyethyl (meth)acrylate and 2-hydroxypropyl (meth)acrylate; aryl (meth)acrylic esters such as phenyl (meth)acrylate and benzyl (meth)acrylate; dicarboxylic diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

Acrylic Resin (B1-3)

As the acrylic resin (B1-3), a resin including a structural unit represented by the following formulae (b5) to (b7) can be used.

[Chemical formula 7]

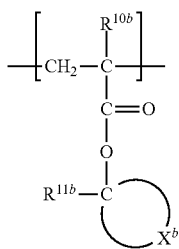

(b5)

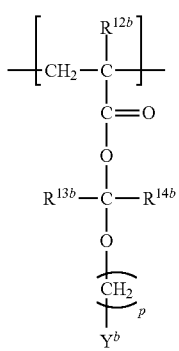

(b6)

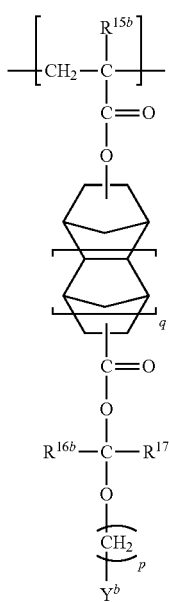

(b7)

In the formulae (b5) to (b7), $R^{10b}$ to $R^{17b}$ each independently represent a hydrogen atom, a linear or branched alkyl group having 1 to 6 carbon atoms, a fluorine atom, or a linear or branched fluorinated alkyl group having 1 to 6 carbon atoms (provided that $R^{11b}$ is not a hydrogen atom); $X^b$ forms a hydrocarbon ring having 5 to 20 carbon atoms together with a carbon atom to which $X^b$ is bonded; $Y^b$ represents an alicyclic group or an alkyl group that may have a substituent; p represents an integer of 0 to 4; and q represents 0 or 1.

Moreover, examples of the linear or branched alkyl group include a methyl group, an ethyl group, a propyl group, an isopropyl group, an n-butyl group, an isobutyl group, a tert-butyl group, a pentyl group, an isopentyl group, and a neopentyl group. Further, the fluorinated alkyl group refers to the alkyl groups of which the hydrogen atoms are partially or entirely substituted with fluorine atoms.

The $R^{11b}$ is preferably a linear or branched alkyl group having 2 to 4 carbon atoms in view of good contrast, resolution, depth and width of focus, or the like; and $R^{13b}$, $R^{14b}$, $R^{16b}$, and $R^{17b}$ are each preferably a hydrogen atom or a methyl group.

The $X^b$ forms an alicyclic group having 5 to 20 carbon atoms together with a carbon atom to which $X^b$ is bonded. Specific examples of the alicyclic group are the groups of monocycloalkanes and polycycloalkanes such as bicycloalkanes, tricycloalkanes, and tetracycloalkanes, from which at least one hydrogen atom is removed. Specific examples thereof are monocycloalkanes such as cyclopentane, cyclohexane, cycloheptane, and cyclooctane, and polycycloalkanes such as adamantane, norbornane, isobornane, tricyclodecane, and tetracyclododecane, from which at least one hydrogen atom is removed. Particularly preferable are cyclohexane and adamantane from which at least one hydrogen atom is removed (that may further have a substituent).

When the alicyclic group of the $X^b$ has a substituent on the ring skeleton, examples of the substituent include polar groups such as a hydroxyl group, a carboxyl group, a cyano group, and an oxygen atom (=O), and linear or branched alkyl groups having 1 to 4 carbon atoms. The polar group is particularly preferably an oxygen atom (=O).

The $Y^b$ is an alicyclic group or an alkyl group; and examples thereof are monocycloalkanes and polycycloalkanes such as bicycloalkanes, tricycloalkanes, and tetracycloalkanes, from which at least one hydrogen atom is removed. Specific examples thereof include monocycloalkanes such as cyclopentane, cyclohexane, cycloheptane, and cyclooctane, and polycycloalkanes such as adamantane, norbornane, isobornane, tricyclodecane, and tetracyclododecane, from which at least one hydrogen atom is removed. Particularly preferred is adamantane from which at least one hydrogen atom is removed (which may further have a substituent).

Moreover, when the alicyclic group of the $Y^b$ has a substituent on the ring skeleton, examples of the substituent include polar groups such as a hydroxyl group, a carboxyl group, a cyano group, and an oxygen atom (=O), and linear or branched alkyl groups having 1 to 4 carbon atoms. The polar group is preferably an oxygen atom (=O) in particular.

Furthermore, when $Y^b$ is an alkyl group, it is preferably a linear or branched alkyl group having 1 to 20 carbon atoms, and more preferably 6 to 15 carbon atoms. Preferably, the alkyl group is an alkoxyalkyl group in particular; and examples of the alkoxyalkyl group include a 1-methoxyethyl group, a 1-ethoxyethyl group, a 1-n-propoxyethyl group, a 1-isopropoxyethyl group, a 1-n-butoxyethyl group, a 1-isobutoxyethyl group, a 1-tert-butoxyethyl group, a 1-methoxypropyl group, a 1-ethoxypropyl group, a 1-methoxy-1-methylethyl group, and a 1-ethoxy-1-methylethyl group.

Preferable specific examples of the structural unit represented by the formula (b5) are those represented by the following formulae (b5-1) to (b5-33).

[Chemical formula 8]
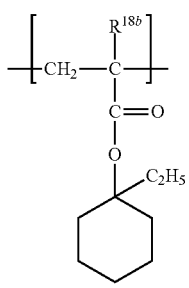 (b5-1)
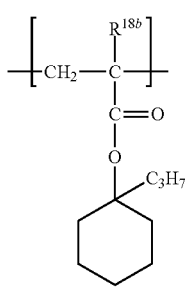 (b5-2)
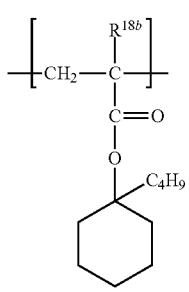 (b5-3)
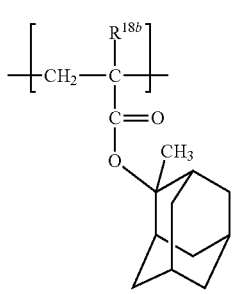 (b5-4)
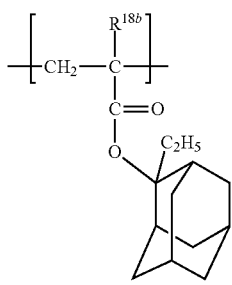 (b5-5)
-continued
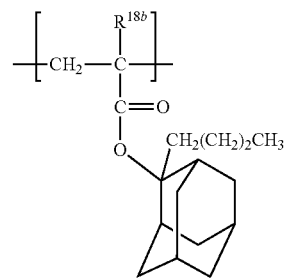 (b5-6)
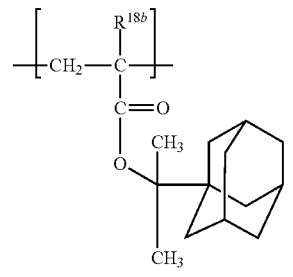 (b5-7)
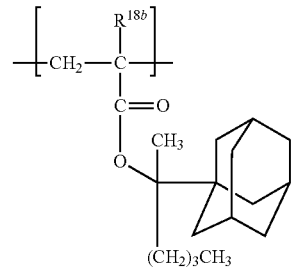 (b5-8)
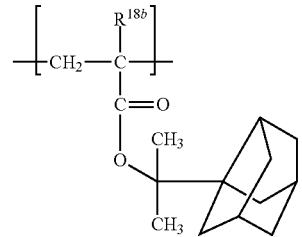 (b5-9)
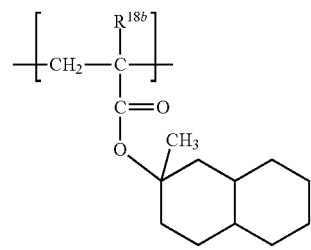 (b5-10)
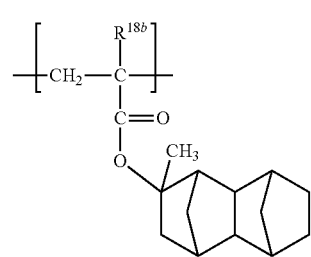 (b5-11)

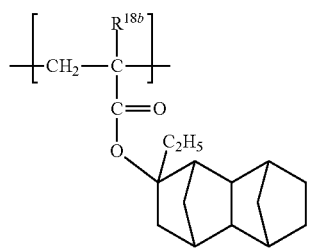 (b5-12)
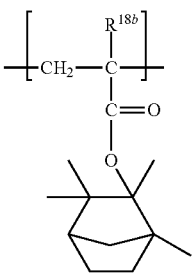 (b5-17)
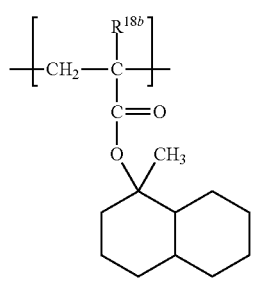 (b5-13)
[Chemical formula 9]
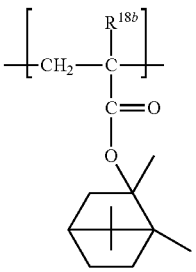 (b5-18)
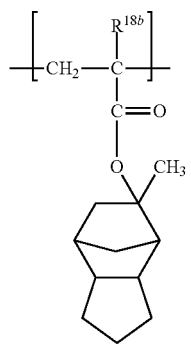 (b5-14)
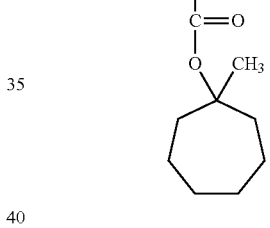 (b5-19)
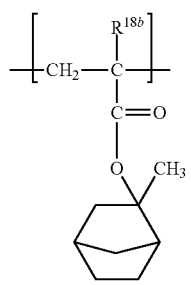 (b5-15)
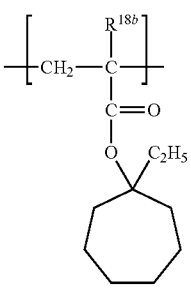 (b5-20)
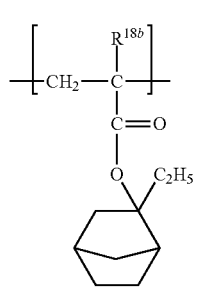 (b5-16)
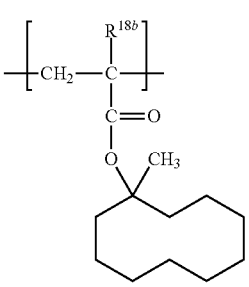 (b5-21)

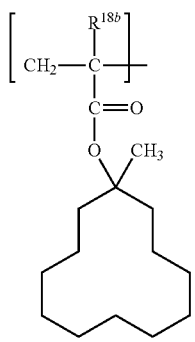 (b5-22)
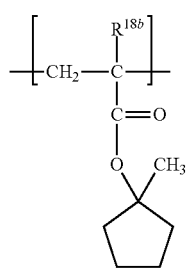 (b5-23)
[Chemical formula 10]
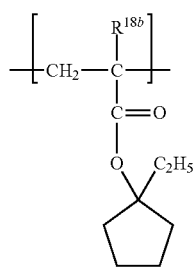 (b5-24)
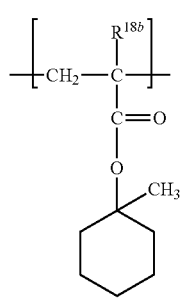 (b5-25)
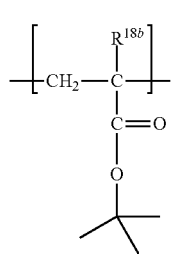 (b5-26)
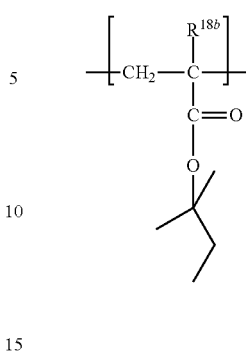 (b5-27)
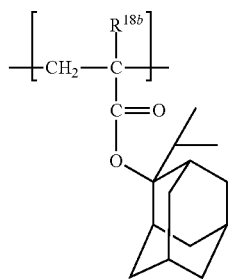 (b5-28)
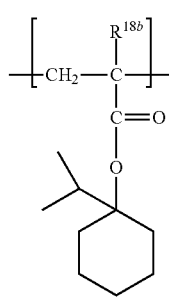 (b5-29)
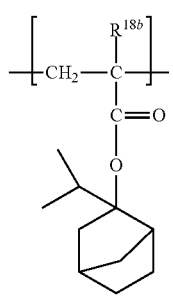 (b5-30)
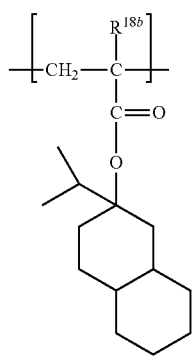 (b5-31)

(b5-32)
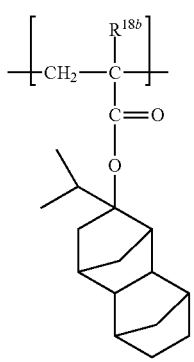
(b5-33)
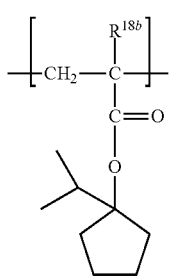
In the formulae (b5-1) to (b5-33), $R^{18b}$ represents a hydrogen atom or a methyl group.
Preferable specific examples of the structural unit represented by the formula (b6) include those represented by the following formulae (b6-1) to (b6-24).
[Chemical formula 11]
(b6-1)
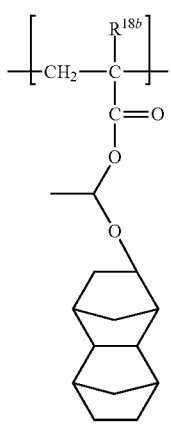
(b6-2)
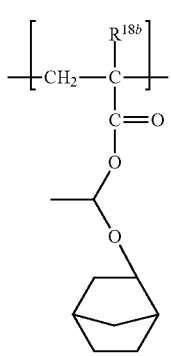
(b6-3)
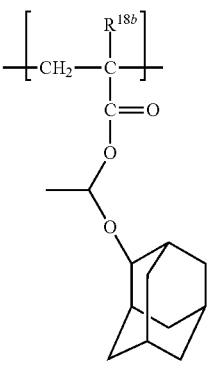
(b6-4)
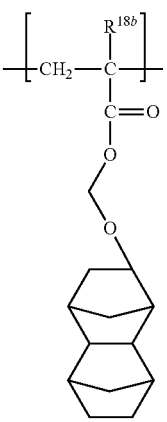
(b6-5)
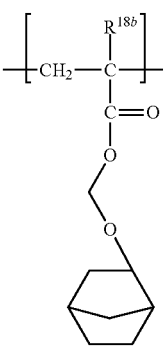
(b6-6)
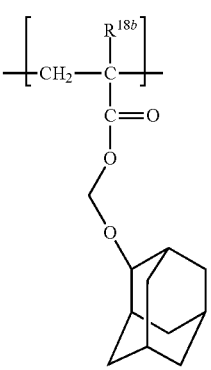

(b6-7)
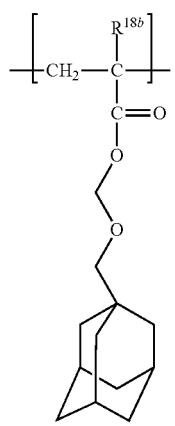
(b6-8)
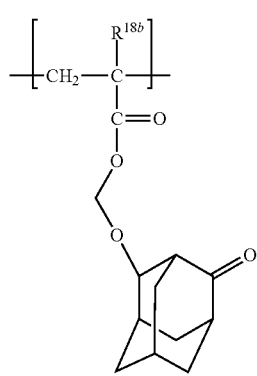
(b6-9)
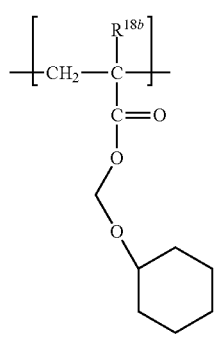
(b6-10)
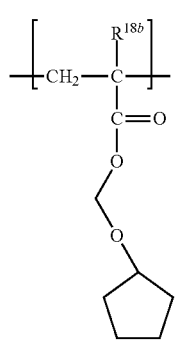
(b6-11)
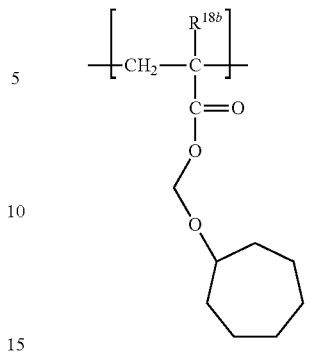
(b6-12)
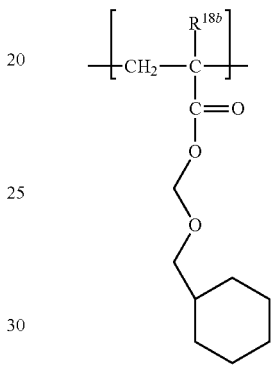
(b6-13)
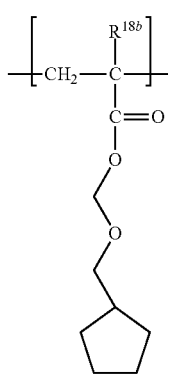
(b6-14)
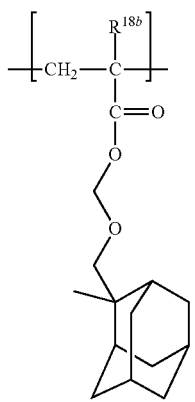

(b6-15)
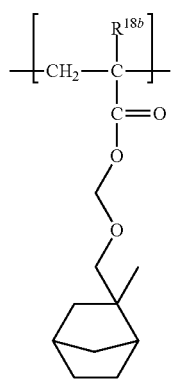
[Chemical formula 12]
(b6-16)
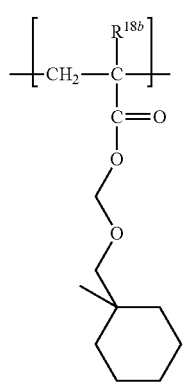
(b6-17)
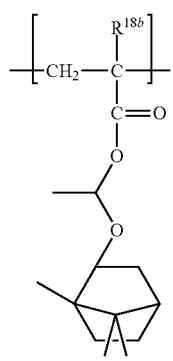
(b6-18)
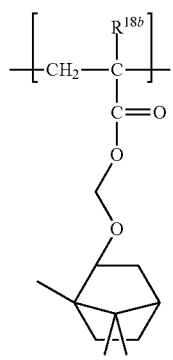
(b6-19)
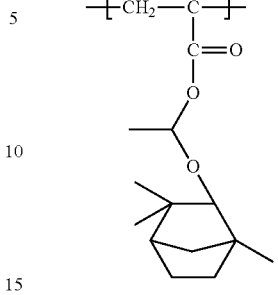
(b6-20)
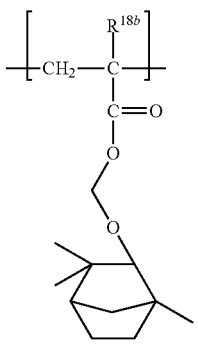
(b6-21)
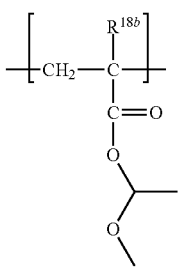
(b6-22)
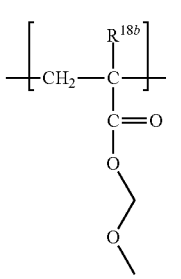
(b6-23)
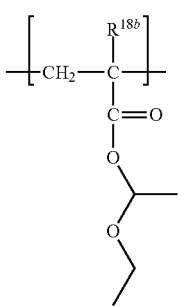

(b6-24)
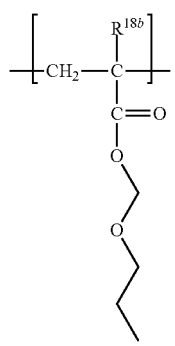
In the formulae (b6-1) to (b6-24), $R^{18b}$ represents a hydrogen atom or a methyl group.
Preferable specific examples of the structural unit represented by the formula (b7) include those represented by the following formulae (b7-1) to (b7-15).
[Chemical formula 13]
(b7-1)
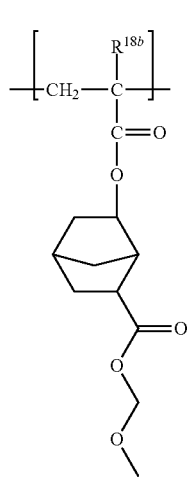
(b7-2)
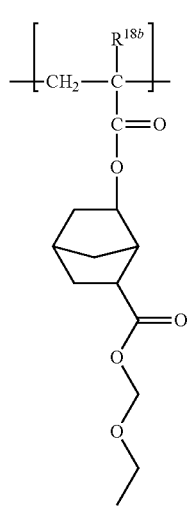
(b7-3)
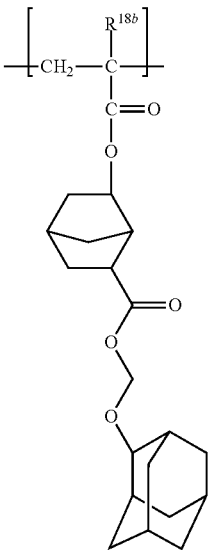
(b7-4)
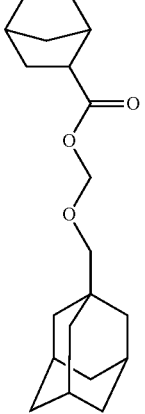

(b7-5) 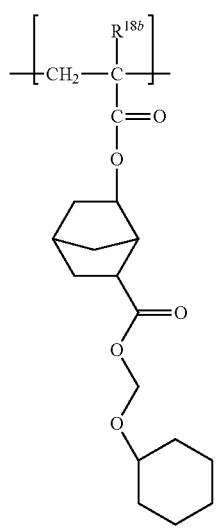
(b7-7) 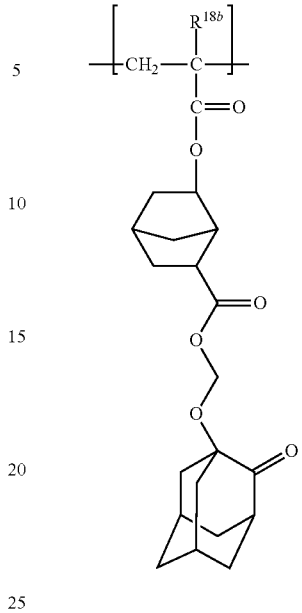
(b7-6) 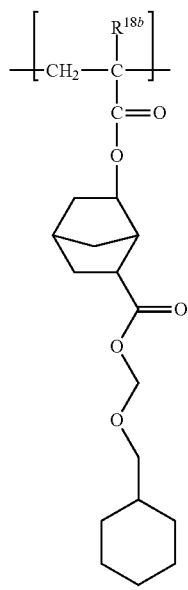
(b7-8) 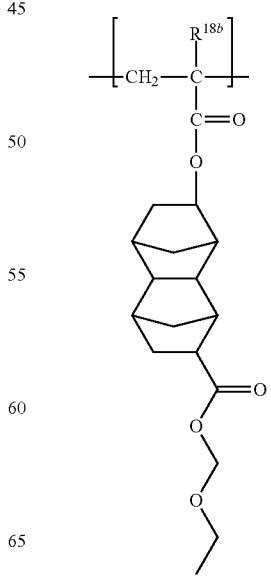

[Chemical formula 14]
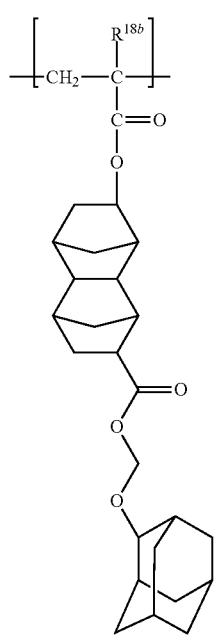
(b7-9)
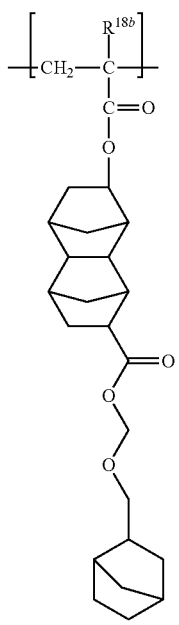
(b7-11)
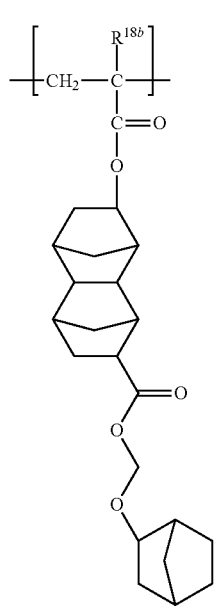
(b7-10)
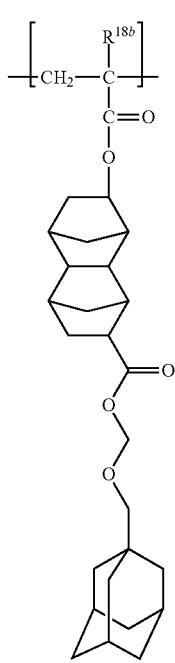
(b7-12)

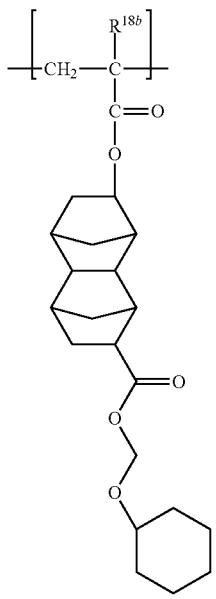

(b7-13)

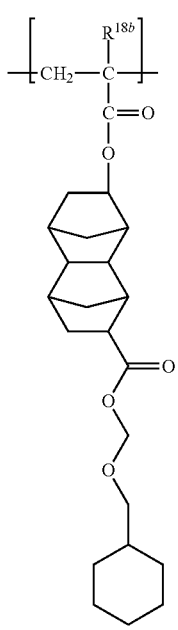

(b7-14)

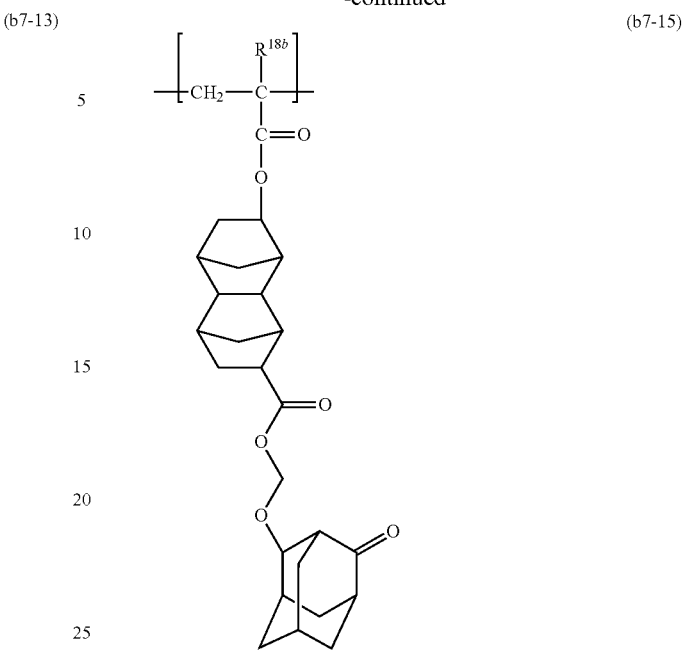

(b7-15)

In the formula (b7-1) to (b7-15), $R^{18b}$ represents a hydrogen atom or a methyl group.

It is preferable that the acrylic resin (B1-3) be a copolymer containing a structural unit derived from a polymerizable compound having an ether bond in addition to the structural units represented by the formulae (b5) to (b7).

Examples of the polymerizable compound having an ether bond include radical polymerizable compounds such as (meth)acrylic acid derivatives having an ether bond and an ester bond, and specific examples thereof include 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolyethylene glycol (meth)acrylate, methoxypolypropylene glycol (meth)acrylate, and tetrahydrofurfuryl (meth)acrylate. Also, the polymerizable compound having an ether bond is preferably 2-methoxyethyl (meth)acrylate, 2-ethoxyethyl (meth)acrylate, or methoxytriethylene glycol (meth)acrylate. These polymerizable compounds may be used alone or in combination of two or more kinds thereof.

Furthermore, the acrylic resin (B1-3) is preferably a copolymer containing a structural unit selected from structural units represented by the formulae (b5) to (b7) and a structural unit derived from a C3 to C12 linear alkyl ester of a (meth)acrylic acid. In the case where the acrylic resin (B1-3) contains such a unit, generation of bubbles in a film thus formed is easily suppressed.

Preferred specific examples of the C3 to C12 linear alkyl ester of a (meth)acrylic acid may include n-butyl(meth)acrylate, n-octyl(meth)acrylate, and n-decyl(meth)acrylate.

Furthermore, the acrylic resin (B1-3) may contain another polymerizable compound as a structural unit in order to moderately control physical or chemical properties. Examples of the polymerizable compound include conventional radical polymerizable compounds and anion polymerizable compounds.

Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; hydroxyalkyl (meth) acrylic esters such as 2-hydroxyethyl (meth)acrylate and 2-hydroxypropyl (meth)acrylate; (meth)acrylic acid esters containing an aromatic group-containing group such as phenyl (meth)acrylate and benzyl (meth)acrylate; dicarboxylic diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide.

Furthermore, examples of the polymerizable compound include (meth)acrylic esters having a non-acid-dissociative aliphatic polycyclic group, and vinyl group-containing aromatic compounds. As the non-acid-dissociative aliphatic polycyclic group, particularly, a tricyclodecanyl group, an adamantyl group, a tetracyclododecanyl group, an isobornyl group, and a norbornyl group are preferred from the viewpoint of easy industrial availability. These aliphatic polycyclic groups may have a linear or branched alkyl group having 1 to 5 carbon atoms as a substituent.

Specific examples of the (meth)acrylates having a non-acid-dissociative aliphatic polycyclic group include those having structures represented by the following formulae (b8-1) to (b8-5).

[Chemical formula 15]

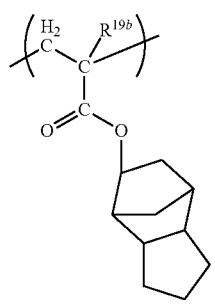

(b8-1)

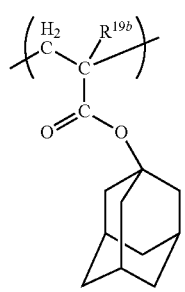

(b8-2)

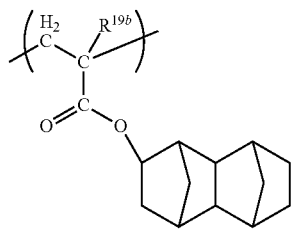

(b8-3)

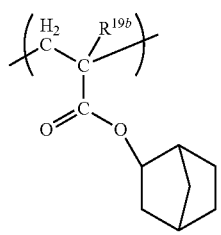

(b8-4)

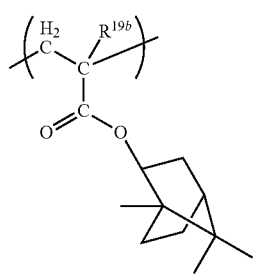

(b8-5)

In the formulae (b8-1) to (b8-5), $R^{19b}$ represents a hydrogen atom or a methyl group.

Among the components (B1), acrylic resins (B1-3) are preferably used. Among such acrylic resins (B1-3), a copolymer having a structural unit represented by the formula (b5), a structural unit derived from a (meth)acrylic acid, a structural unit derived from an alkyl (meth)acrylic ester, and a structural unit derived from a (meth)acrylic acid aryl ester is preferred.

Such a copolymer is preferably a copolymer represented by the following general formula (b9).

[Chemical formula 16]

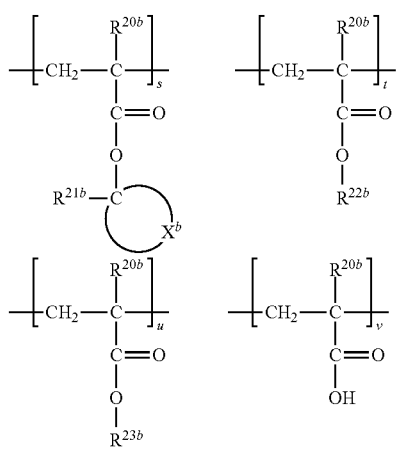

(b9)

In the general formula (b9), $R^{20b}$ represents a hydrogen atom or a methyl group; $R^{21b}$ represents a linear or branched alkyl group having 2 to 4 carbon atoms; $X^b$ is as defined above; $R^{22b}$ represents a linear or branched alkyl group having 1 to 6 carbon atoms or an alkoxyalkyl group having 1 to 6 carbon atoms; and $R^{23b}$ represents an aryl group having 6 to 12 carbon atoms.

Further, in the copolymers represented by the general formula (b9), s, t, u, and v each represent a molar ratio of the structural unit, s is 8 mol % to 45 mol %, t is 10 mol % to 65 mol %, u is 3 mol % to 25 mol %, and v is 6 mol % to 25 mol %.

The polystyrene-equivalent mass average molecular weight of the component (B1) is preferably 10000 to 600000, more preferably 20000 to 400000, and even more preferably 30000 to 300000. By thus adjusting the mass average molecular weight, the resin layer of the thick film can maintain sufficient strength without deteriorating peel properties with a substrate, and also swelling of profiles in plating, and generation of cracks can be prevented.

It is also preferable that the component (B1) be a resin having a dispersivity of 1.05 or more. The dispersivity as mentioned herein indicates a value of a mass average molecular weight divided by a number average molecular weight. By adjusting the dispersivity in the range described above, problems with respect to stress resistance on intended plating or possible swelling of metal layers resulting from the plating process can be avoided.

The content of the component (B1) is preferably 5% to 60% by mass with respect to the total mass of the chemically amplified positive-type photosensitive resin composition.

Photoacid Generator (C)

The photoacid generator (C) used in the present invention is not particularly limited as long as it is a compound capable of producing an acid when irradiated with an active beam or radiation. The components (C) may be used singly or in combination of two or more kinds thereof.

As the component (C), the photoacid generators in the first to fifth aspects as described later are preferred. Hereinafter, among the components (C), suitable components will be described in the first to fifth aspects.

The first aspect in the component (C) may include a compound represented by the following formula (c1).

[Chemical formula 17]

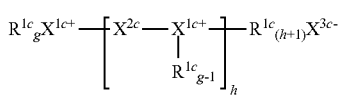

(c1)

In the formula (c1), $X^{1c}$ represents a sulfur atom having a valence of g or an iodine atom, and g represents 1 or 2. h represents the number of repeating units in the structure within parentheses. $R^{1c}$ represents an organic group that is bonded to $X^{1c}$, and represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms, and $R^{1c}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1c}$s is g+h (g−1)+1, and the $R^{1c}$s may be respectively the same as or different from each other. Further, two or more $R^{1c}$s may be bonded to each other directly or via —O—, —S—, —SO—, —$SO_2$—, —NH—, —$NR^{2c}$—, —CO—, —COO—, —CONH—, an alkylene group having 1 to 3 carbon atoms, or a phenylene group, and may form a ring structure containing $X^{1c}$. $R^{2c}$ represents an alkyl group having 1 to 5 carbon atoms, or an aryl group having 6 to 10 carbon atoms.

$X^{2C}$ is a structure represented by the following formula (c2):

[Chemical formula 18]

(c2)

In the formula (c2), $X^{4c}$ represents an alkylene group having 1 to 8 carbon atoms, an arylene group having 6 to 20 carbon atoms, or a divalent group of a heterocyclic compound having 8 to 20 carbon atoms; $X^{4c}$ may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and a halogen atom. $X^{5c}$ represents —O—, —S—, —SO—, —$SO_2$—, —NH—, —$NR^{2c}$—, —CO—, —COO—, —CONH—, an alkylene group having 1 to 3 carbon atoms, or a phenylene group. h represents the number of repeating units of the structure in parentheses. $X^{4c}$'s in the number of h+1 and $X^{5c}$'s in the number of h may be the same as or different from each other. $R^{2c}$ has the same definition as described above.

$X^{3c-}$ represents a counterion of an onium, and examples thereof include a fluorinated alkylfluorophosphoric acid anion represented by the following formula (c17) or a borate anion represented by the following formula (c18).

[Chemical formula 19]

(c17)

In the formula (c17), $R^{3c}$ represents an alkyl group in which 80 mol % or more of the hydrogen atoms are substituted with fluorine atoms. j represents the number of $R^{3c}$s and is an integer from 1 to 5. $R^{3c}$s in the number of j may be respectively the same as or different from each other.

[Chemical formula 20]

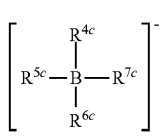

(c18)

In the formula (c18), $R^{4c}$ to $R^{7c}$ each independently represent a fluorine atom or a phenyl group, and a part or all of the hydrogen atoms of the phenyl group may be substituted with at least one selected from the group consisting of a fluorine atom and a trifluoromethyl group.

Examples of the onium ion in the compound represented by the formula (c1) include triphenylsulfonium, tri-p-tolylsulfonium, 4-(phenylthio)phenyldiphenylsulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, 4-(4-benzoyl-2- chlorophenylthio)phenylbis(4-fluorophenyl)sulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfonium, 2-naphthylmethyl(1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl(p-tolyl)iodonium.

Among the onium ions in the compound represented by the formula (c1), a preferred onium ion may be a sulfonium ion represented by the following formula (c19):

[Chemical formula 21]

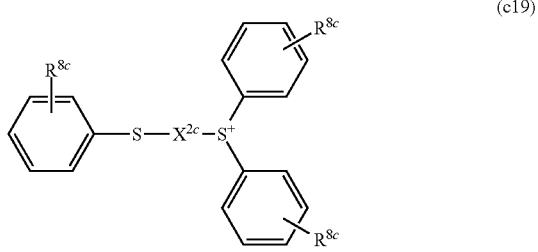

(c19)

in the formula (c19), $R^{8c}$s each independently represent a hydrogen atom or a group selected from the group consisting of alkyl, hydroxyl, alkoxy, alkylcarbonyl, alkylcarbonyloxy, alkyloxycarbonyl, a halogen atom, an aryl which may have a substituent, and arylcarbonyl. $X^{2c}$ has the same definition as $X^{2c}$ in the formula (c1).

Specific examples of the sulfonium ion represented by the formula (c19) include 4-(phenylthio)phenyldiphenylsulfonium, 4-(4-benzoyl-2-chlorophenylthio)phenylbis(4-fluorophenyl)sulfonium, 4-(4-benzoylphenylthio)phenyldiphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, and diphenyl[4-(p-terphenylthio)phenyl]diphenylsulfonium.

In regard to the fluorinated alkylfluorophosphoric acid anion represented by the formula (c17), $R^{3c}$ represents an alkyl group substituted with a fluorine atom, and a preferred carbon number is 1 to 8, while a more preferred carbon number is 1 to 4. Specific examples of the alkyl group include linear alkyl groups such as methyl, ethyl, propyl, butyl, pentyl and octyl; branched alkyl groups such as isopropyl, isobutyl, sec-butyl, and tert-butyl; and cycloalkyl groups such as cyclopropyl, cyclobutyl, cyclopentyl, and cyclohexyl. The proportion of hydrogen atoms substituted with fluorine atoms in the alkyl groups is usually 80 mol % or more, preferably 90 mol % or more, and even more preferably 100 mol %. If the substitution ratio of fluorine atoms is less than 80 mol %, the acid strength of the onium fluorinated alkylfluorophosphate represented by the formula (c1) decreases.

A particularly preferable example of $R^{3c}$ is a linear or branched perfluoroalkyl group having 1 to 4 carbon atoms and a substitution ratio of fluorine atoms of 100 mol %. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. The number of $R^{3c}$s, j, represents an integer from 1 to 5, and is preferably 2 to 4, and particularly preferably 2 or 3.

Preferred specific examples of the fluorinated alkylfluorophosphoric acid anion include $[(CF_3CF_2)_2PF_4]^-$, $[(CF_3CF_2)_3PF_3]^-$, $[(CF_3)_2CF)_2PF_4]^-$, $[(CF_3)_2CF)_3PF_3]^-$, $[(CF_3CF_2CF_2)_2PF_4]^-$, $[(CF_3CF_2CF_2)_3PF_3]^-$, $[(CF_3)_2CFCF_2)_2PF_4]^-$, $[(CF_3)_2CFCF_2)_3PF_3]^-$, $[(CF_3CF_2CF_2CF_2)_2PF_4]^-$, and $[CF_3CF_2CF_2)_3PF_3]^-$. Among these, $[(CF_3CF_2)_3PF_3]^-$, $[(CF_3CF_2CF_2)_3PF_3]^-$, $[(CF_3)_2CF)_3PF_3]^-$, $[(CF_3)_2CF)_2PF_4]^-$, $[((CF_3)_2CFCF_2)_3PF_3]^-$, and $[((CF_3)_2CFCF_2)_2PF_4]^-$ are particularly preferred.

Preferred specific examples of the borate anion represented by the formula (c18) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis(pentafluorophenyl)borate ($[(C_6F_5)_2BF_2]^-$), trifluoro(pentafluorophenyl)borate ($[(C_6F_5)BF_3]^-$), and tetrakis(difluorophenyl)borate ($[B(C_6H_3F_2)_4]^-$). Among these, tetrakis(pentafluorophenyl)borate ($[B(C_6F_5)_4]^-$) is particularly preferred.

The second aspect of the component (C) include halogen-containing triazine compounds such as 2,4-bis(trichloromethyl)-6-piperonyl-1,3,5-triazine,
2,4-bis(trichloromethyl)-6-[2-(2-furyl)ethenyl]-s-triazine,
2,4-bis(trichloromethyl)-6-[2-(5-methyl-2-furyl)ethenyl]-s-triazine,
2,4-bis(trichloromethyl)-6-[2-(5-ethyl-2-furyl)ethenyl]-s-triazine,
2,4-bis(trichloromethyl)-6-[2-(5-propyl-2-furyl)ethenyl]-s-triazine,
2,4-bis(trichloromethyl)-6-[2-(3,5-dimethoxyphenyl)ethenyl]-s-triazine,
2,4-bis(trichloromethyl)-6-[2-(3,5-diethoxyphenyl)ethenyl]-s-triazine,
2,4-bis(trichloromethyl)-6-[2-(3,5-dipropoxyphenyl)ethenyl]-s-triazine,
2,4-bis(trichloromethyl)-6-[2-(3-methoxy-5-ethoxyphenyl)ethenyl]-s-triazine,
2,4-bis(trichloromethyl)-6-[2-(3-methoxy-5-propoxyphenyl)ethenyl]-s-triazine,
2,4-bis(trichloromethyl)-6-[2-(3,4-methylenedioxyphenyl)ethenyl]-s-triazine,
2,4-bis(trichloromethyl)-6-(3,4-methylenedioxyphenyl)-s-triazine,
2,4-bis-trichloromethyl-6-(3-bromo-4-methoxy)phenyl-s-triazine,
2,4-bis-trichloromethyl-6-(2-bromo-4-methoxy)phenyl-s-triazine,
2,4-bis-trichloromethyl-6-(2-bromo-4-methoxy)styrylphenyl-s-triazine,
2,4-bis-trichloromethyl-6-(3-bromo-4-methoxy)styrylphenyl-s-triazine,
2-(4-methoxyphenyl)-4,6-bis(trichloromethyl)-1,3,5-triazine,
2-(4-methoxynaphthyl)-4,6-bis(trichloromethyl)-1,3,5-triazine,
2-[2-(2-furyl)ethenyl]-4,6-bis(trichloromethyl)-1,3,5-triazine,
2-[2-(5-methyl-2-furyl)ethenyl]-4,6-bis(trichloromethyl)-1,3,5-triazine,
2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine,
2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following formula (c3) such as tris(2,3-dibromopropyl)isocyanurate.

[Chemical formula 22]

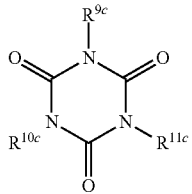

(c3)

In the formula (c3), $R^{9c}$, $R^{10c}$ and $R^{11c}$ each independently represent a halogenated alkyl group.

Further, the third aspect of the component (C) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile and α-(ethylsulfonyloxyimino)-1-cyclopentenylacetonitrile, and compounds represented by the following formula (c4) having an oximesulfonate group.

[Chemical formula 23]

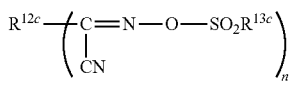

(c4)

In the formula (c4), $R^{12c}$ represents a monovalent, divalent or trivalent organic group; $R^{13c}$ represents a substituted or unsubstituted saturated hydrocarbon group, an unsaturated hydrocarbon group, or an aromatic compound group; and n represents the number of repeating units of the structure in the parentheses.

In the formula (c4), the aromatic compound group indicates a group of compounds having physical and chemical properties characteristic of aromatic compounds, and examples thereof include aryl groups such as a phenyl group and a naphthyl group, and heteroaryl groups such as a furyl group and a thienyl group. These may have one or more appropriate substituents such as a halogen atom, an alkyl group, an alkoxy group, and a nitro group on the rings. $R^{13c}$ is particularly preferably an alkyl group having 1 to 6 carbon atoms such as a methyl group, an ethyl group, a propyl group, and a butyl group. In particular, compounds in which $R^{12c}$ represents an aromatic compound group and $R^{13c}$ represents an alkyl group having 1 to 4 carbon atoms are preferred.

Examples of the acid generator represented by the formula (c4) include compounds in which $R^{12c}$ is any one of a phenyl group, a methylphenyl group, and a methoxyphenyl group, and $R^{13c}$ is a methyl group, when n is 1; and specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, and [2-(propylsulfonyloxyimino)-2,3-dihydroxythiophene-3-ylidene](o-tolyl)acetonitrile. When n is 2, specific examples of the photoacid generator represented by the formula (c4) include photoacid generators represented by the following formulae.

[Chemical formula 24]

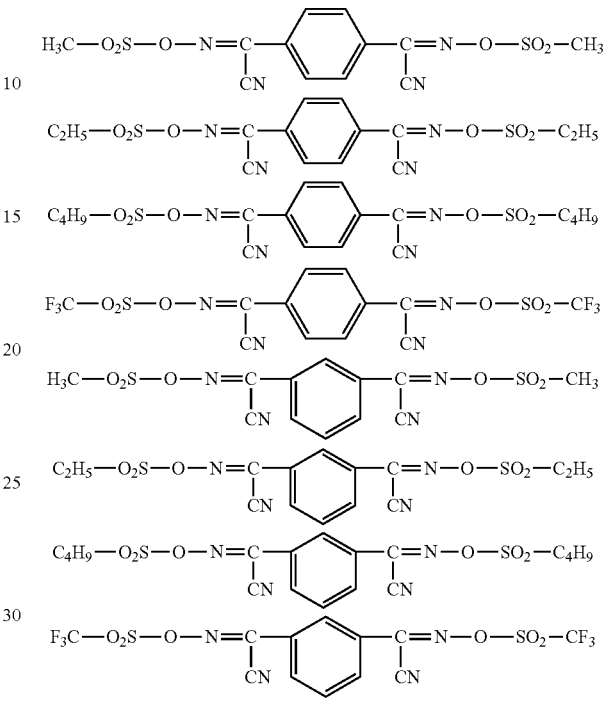

In addition, the fourth aspect of the component (C) may include onium salts that have a naphthalene ring at their cation moiety. The expression "have a naphthalene ring" indicates having a structure derived from naphthalene and also indicates at least two ring structures and their aromatic properties are maintained. The naphthalene ring may have a substituent such as a linear or branched alkyl group having 1 to 6 carbon atoms, a hydroxyl group, and a linear or branched alkoxy group having to 6 carbon atoms. The structure derived from the naphthalene ring, which may be of a monovalent group (one free valance) or of a divalent group (two free valences) or higher valent group, is desirably of a monovalent group (in this regard, the number of free valance is counted except for the portions connecting with the substituents as described above). The number of naphthalene rings is preferably 1 to 3.

The cation moiety of the onium salt having a naphthalene ring at such a cation moiety is preferably a structure represented by the following formula (c5).

[Chemical formula 25]

(c5)

In the formula (c5), at least one of $R^{14c}$, $R^{15c}$, and $R^{16c}$ represents a group represented by the following formula (c6), and the remaining represents a linear or branched alkyl group having 1 to 6 carbon atoms, a phenyl group which may have a substituent, a hydroxyl group, or a linear or branched alkoxy group having 1 to 6 carbon atoms. Alternatively, one of $R^{14c}$, $R^{15c}$, and $R^{16c}$ is a group represented by the following formula (c6), and the remaining two are each independently a linear or branched alkylene group having 1 to 6 carbon atoms, and terminals thereof may be bonded to each other to form a ring structure.

[Chemical formula 26]

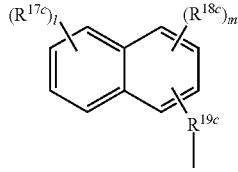

(c6)

In the formula (c6), $R^{17c}$ and $R^{18c}$ each independently represent a hydroxyl group, a linear or branched alkoxy group having 1 to 6 carbon atoms, or a linear or branched alkyl group having 1 to 6 carbon atoms; and $R^{19c}$ represents a single bond or a linear or branched alkylene group having 1 to 6 carbon atoms that may have a substituent. l and m each independently represent an integer of 0 to 2, and l+m is 3 or less. In this regard, when there exists a plurality of $R^{17c}$, they may be the same as or different from each other. Further, when there exist a plurality of $R^{18c}$, they may be the same as or different from each other.

Preferably, among $R^{14c}$, $R^{15c}$, and $R^{16c}$ as above, the number of groups represented by the formula (c6) is one in view of the stability of the compound, and the remaining are linear or branched alkylene groups having 1 to 6 carbon atoms of which the terminals may be bonded to each other to form a ring. In this case, the two alkylene groups described above form a 3- to 9-membered ring including sulfur atom(s). The number of atoms which form the ring (including sulfur atom(s)) is preferably 5 or 6.

Furthermore, examples of the substituent which the alkylene group may have include an oxygen atom (in this case, a carbonyl group is formed together with a carbon atom that constitutes the alkylene group) and a hydroxyl group.

Incidentally, examples of the substituent which the phenyl group may have include a hydroxyl group, a linear or branched alkoxy group having 1 to 6 carbon atoms and a linear or branched alkyl group having 1 to 6 carbon atoms.

Suitable examples of the cation moiety include those represented by the following formulae (c7) and (c8), and the structure represented by the following formula (c8) is particularly preferred.

[Chemical formula 27]

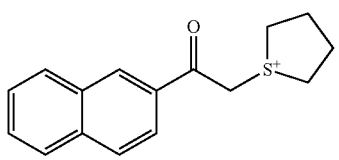

(c7)

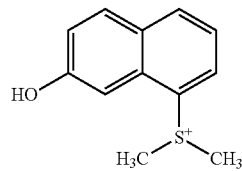

(c8)

The cation moiety may be an iodonium salt or a sulfonium salt, but is desirably a sulfonium salt in view of acid-generating efficiency or the like.

Therefore, a suitable anion moiety of the onium salt having a naphthalene ring at the cation moiety is desirably an anion capable of forming a sulfonium salt.

Examples of the anion moiety of the acid generator include fluoroalkylsulfonic acid ions, of which hydrogen atom(s) is partially or entirely fluorinated, or aryl sulfonic acid ions.

The alkyl group of the fluoroalkylsulfonic acid ions may be linear, branched, or cyclic and have 1 to 20 carbon atoms. Preferably, the carbon number is 1 to 10 in view of bulkiness and diffusion distance of the produced acid. In particular, branched or cyclic groups are preferred since they have shorter diffusion length. Also, a methyl group, an ethyl group, a propyl group, a butyl group, an octyl group, and the like may be preferred since they can be synthesized inexpensively.

The aryl group in the aryl sulfonic acid ions may be an aryl group having 6 to 20 carbon atoms, and examples thereof include a phenyl group and a naphthyl group, which may be unsubstituted or substituted with an alkyl group or a halogen atom. In particular, aryl groups having 6 to 10 carbon atoms are preferred since they can be synthesized inexpensively. Preferable specific examples of the aryl group include a phenyl group, a toluenesulfonyl group, an ethylphenyl group, a naphthyl group, and a methylnaphthyl group.

In the case where hydrogen atoms in the fluoroalkylsulfonic acid ion or the aryl sulfonic acid ion are partially or entirely substituted with a fluorine atom, the fluorination rate is preferably 10% to 100%, and more preferably 50% to 100%; it is particularly preferable that all hydrogen atoms be each substituted with a fluorine atom due to higher acid strength. Specific examples thereof include trifluoromethane sulfonate, perfluorobutane sulfonate, perfluorooctane sulfonate, and perfluorobenzene sulfonate.

Among these, preferable examples of the anion moiety include those represented by the following formula (c9).

(c9)

In the formula (c9), $R^{20c}$ represents a group represented by the following formula (c10) or (c11), or a group represented by the following formula (c12).

[Chemical formula 28]

(c10)

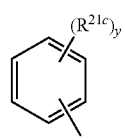

(c11)

-continued

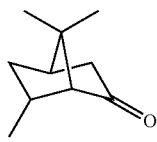
(c12)

In the formula (c10), x represents an integer of 1 to 4. Also, in the formula (c11), $R^{21c}$ represents a hydrogen atom, a hydroxyl group, a linear or branched alkyl group having 1 to 6 carbon atoms, or a linear or branched alkoxy group having 1 to 6 carbon atoms; and y represents an integer of 1 to 3. Of these, trifluoromethane sulfonate, and perfluorobutane sulfonate are preferable in view of safety.

In addition, a nitrogen-containing moiety represented by the following formula (c13) or (c14) may also be used as the anion moiety.

[Chemical formula 29]

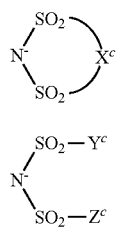
(c13)

(c14)

In the formulae (c13) and (c14), $X^c$ represents a linear or branched alkylene group of which at least one hydrogen atom is substituted with a fluorine atom, the carbon number of the alkylene group is 2 to 6, preferably 3 to 5, and most preferably 3. In addition, $Y^c$ and $Z^c$ each independently represent a linear or branched alkyl group of which at least one hydrogen atom is substituted with a fluorine atom, the carbon number of the alkyl group is 1 to 10, preferably 1 to 7, and more preferably 1 to 3.

The smaller number of carbon atoms in the alkylene group of $X^c$, or in the alkyl group of $Y^c$ or $Z^c$ is preferred since the solubility into organic solvent is preferable.

In addition, the larger number of hydrogen atoms each substituted with a fluorine atom in the alkylene group of $X^c$, or in the alkyl group of $Y^c$ or $Z^c$ is preferred since the acid strength becomes greater. The percentage of fluorine atoms in the alkylene group or an alkyl group, i.e., the fluorination rate is preferably 70% to 100% and more preferably 90% to 100%, and most preferred are perfluoroalkylene or perfluoroalkyl groups in which all of the hydrogen atoms are each substituted with a fluorine atom.

Preferable examples of the onium salts having a naphthalene ring at their cation moieties include compounds represented by the following formulae (c15) and (c16).

[Chemical formula 30]

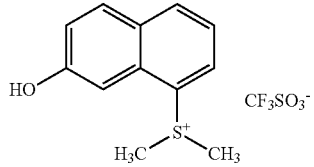
(c15)

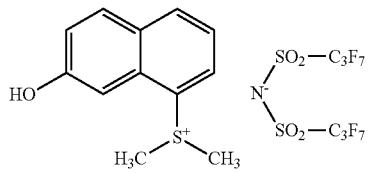
(c16)

Also, the fifth aspect of the component (C) may include bissulfonyldiazomethanes such as bis(p-toluenesulfonyl)diazomethane, bis(1,1-dimethyl ethylsulfonyl)diazomethane, bis(cyclohexylsulfonyl)diazomethane, and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate, and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide, and N-methylsulfonyloxyphthalimide; trifluoromethane sulfonates such as N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate, and (p-tert-butylphenyl)diphenylsulfonium trifluoromethanesulfonate; benzointosylates such as benzointosylate and α-methylbenzointosylate; and other diphenyliodonium salts, triphenylsulfonium salts, phenyldiazonium salts, and benzylcarbonates.

The content of the component (C) is not particularly limited as long as the purpose of the present invention is not impaired. The content is preferably 0.1% by mass to 10% by mass, and more preferably 0.5% by mass to 3% by mass, with respect to the total mass of the chemically amplified positive-type photosensitive resin composition.

Alkali-Soluble Resin (D)

The chemically amplified positive-type photosensitive resin composition may further contain an alkali-soluble resin (D) (hereinafter also referred to as a "component (D)") in order to improve crack resistance. The alkali-soluble resin as mentioned herein may be determined as follows. A solution of the resin to give a resin concentration of 20% by mass (solvent: propylene glycol monomethyl ether acetate) is used to form a resin film having a film thickness of 1 μm on a substrate, followed by immersion in an aqueous 2.38%-by-mass TMAH solution for 1 min. If the resin was dissolved in an amount of 0.01 μm or more, the resin is defined to be alkali-soluble. The component (D) may be used alone or in combination of two or more kinds thereof. Preferable examples of the component (D) include a novolak resin (D1), a polyhydroxystyrene resin (D2), and an acrylic resin (D3).

Novolak Resin (D1)

The novolak resin (D1) may be prepared by addition condensation between, for example, aromatic compounds having a phenolic hydroxy group (hereinafter merely referred to as "phenols") and aldehydes in the presence of an acid catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, and β-naphthol.

Examples of the aldehydes include formaldehyde, furfural, benzaldehyde, nitrobenzaldehyde, and acetaldehyde.

The catalyst used in the addition condensation reaction is not particularly limited, but examples thereof include hydrochloric acid, nitric acid, sulfuric acid, formic acid, oxalic acid, and acetic acid in the case of an acid catalyst.

Furthermore, the flexibility of the novolak resins can be enhanced even more when o-cresol is used, a hydrogen atom of a hydroxyl group in the resins is substituted with other substituents, or bulky aldehydes are used.

The mass average molecular weight of the novolak resin (D1) is preferably 1000 to 50000.

Polyhydroxystyrene Resin (D2)

Examples of the hydroxystyrene-based compound constituting the polyhydroxystyrene resin (D2) include p-hydroxystyrene, α-methylhydroxystyrene, and α-ethylhydroxystyrene.

Incidentally, the polyhydroxystyrene resin (D2) is preferably prepared to be a copolymer with a styrene resin. Examples of the styrene-based compound constituting the styrene resin include styrene, chlorostyrene, chloromethylstyrene, vinyltoluene, and α-methylstyrene.

The mass average molecular weight of the polyhydroxystyrene resin (D2) is preferably 1000 to 50000.

Acrylic Resin (D3)

The acrylic resin (D3) includes a structural unit derived from a (meth)acrylic acid or a (meth)acrylic acid derivative, such as (meth)acrylic acid, (meth)acrylate, and (meth)acrylic amide, and is not particularly limited as long as it has a predetermined solubility in alkali.

It is preferable that the acrylic resin (D3) contain a structural unit derived from a polymerizable compound containing a carboxyl group. Examples of the polymerizable compound including a carboxyl group include monocarboxylic acids such as acrylic acid, methacrylic acid, and crotonic acid; dicarboxylic acids such as maleic acid, fumaric acid, and itaconic acid; and a compound including a carboxyl group and an ester bond such as 2-methacryloyloxyethyl succinic acid, 2-methacryloyloxyethyl maleic acid, 2-methacryloyloxyethyl phthalic acid, or 2-methacryloyloxyethyl hexahydrophthalic acid. The polymerizable compound including a carboxyl group is preferably acrylic acid or methacrylic acid. These polymerizable compounds may be used alone or in combination of two or more kinds thereof.

It is preferable that the acrylic resin (D3) contain a structural unit derived from a polymerizable compound including a carboxyl group and a structural unit derived from a C3 to C12 linear alkyl ester of a (meth)acrylic acid. When the acrylic resin (D3) contains such a unit, generation of bubbles in a film to be formed is easily suppressed.

Preferable specific examples of the C3 to C12 linear alkyl ester of a (meth)acrylic acid include n-butyl(meth)acrylate, n-octyl(meth)acrylate, and n-decyl (meth)acrylate.

It is preferable that the acrylic resin (D3) as described above contain a structural unit derived from a polymerizable compound including a carboxyl group and a structural unit derived from a C3 to C12 linear alkyl ester of a (meth)acrylic acid.

In addition, the acrylic resin (D3) may contain a structural unit derived from a polymerizable compound other than the C3 to C12 linear alkyl ester of (meth)acrylic acid and a polymerizable compound including a carboxyl group.

Examples of such a polymerizable compound include (meth)acrylic acid derivatives containing an ether bond and an ester bond, such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, and tetrahydrofurfuryl (meth)acrylate; (meth)acrylic acid hydroxyalkyl esters such as 2-hydroxyethyl (meth)acrylate and 2-hydroxypropyl (meth)acrylate; (meth)acrylic acid esters including a group which contains an aromatic group such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methyl hydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

The mass average molecular weight of the acrylic resin (D3) is preferably 50000 to 800000.

The content of the component (D), in the case where the total amount of the component (B1) and the component (D) is taken as 100 parts by mass, is preferably 0 parts by mass to 80 parts by mass, and more preferably 0 parts by mass to 60 parts by mass. By adjusting the content of the component (D) to the range described above, there is a tendency for resistance to crack to increase, and film loss at the time of development can be prevented.

Acid Diffusion Control Agent (E)

In order to improve the resist pattern shape, the post exposure stability, and the like, it is preferable that the chemically amplified positive-type photosensitive resin composition further contain an acid diffusion control agent (E) (hereinafter also referred to as a "component (E)"). The components (E) may be used singly or in combination of two or more kinds thereof. The component (E) is preferably a nitrogen-containing compound (E1), and an organic carboxylic acid, or an oxo acid of phosphorus or a derivative thereof (E2) may be further included as needed.

Nitrogen-Containing Compound (E1)

Examples of the nitrogen-containing compound (E1) include trimethylamine, diethylamine, triethylamine, di-n-propylamine, tri-n-propylamine, tri-n-pentylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri(2-pyridyl)-S-triazine, morpholine, 4-methylmorpholine, piperazine, 1,4-dimethylpiperazine, 1,4-diazabicyclo[2.2.2]octane, and pyridine. These may be used alone or in combination of two or more kinds thereof.

The nitrogen-containing compound (E1) may be used in an amount preferably in the range of 0 parts by mass to 5 parts by mass, and particularly preferably in the range of 0 parts by mass to 3 parts by mass, with respect to 100 parts by mass of total mass of the component (B1) and the component (D).

Organic Carboxylic Acid or Oxo Acid of Phosphorus or Derivative Thereof (E2)

Among the organic carboxylic acid, or the oxo acid of phosphorus or a derivative thereof (E2), specific preferable examples of the organic carboxylic acid include malonic acid, citric acid, malic acid, succinic acid, benzoic acid, and salicylic acid, and salicylic acid is particularly preferred.

Examples of the oxo acid of phosphorus or a derivative thereof include phosphoric acid and derivatives thereof such as esters thereof such as, for example, phosphoric acid, phosphoric acid di-n-butyl ester, and phosphoric acid diphenyl ester; phosphonic acid and derivatives thereof such as esters thereof such as, for example, phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as esters thereof such as, for example, phosphinic acid and phenylphosphinic acid; and the like. Among these, phosphonic acid is particularly preferred. These may be used alone or in combination of two or more kinds thereof.

The organic carboxylic acid, or the oxo acid of phosphorus or the derivative thereof (E2) may be used in an amount preferably in the range of 0 parts by mass to 5 parts by mass, and particularly preferably in the range of 0 parts by mass to 3 parts by mass, with respect to 100 parts by mass of total mass of the component (B1) and the component (D).

Moreover, in order to form a salt to allow for stabilization, the organic carboxylic acid, or the oxo acid of phosphorous or the derivative thereof (E2) is preferably used in an amount equivalent to that of the nitrogen-containing compound (E1).

Alkali-Metal Salt (F)

The chemically amplified positive-type photosensitive resin composition may further contain an alkali metal salt (F) (hereinafter also referred to as a "component (F)"). When the alkali metal salt (F) is incorporated into the chemically amplified positive-type photosensitive resin composition, in the case of forming a photoresist pattern for forming connecting terminals such as bumps and metal posts on a support by using a photosensitive resin composition, a photoresist pattern having a nonresist section in which the width of the bottom (the support surface side) is larger than the width of the top (the surface side of the photoresist layer), can be easily formed. When a nonresist section in which the width of the bottom (the support surface side) is larger than the width of the top (the surface side of the photoresist layer) is formed, in the case of forming bumps, metal posts, and the like by embedding a conductor such as copper in the nonresist section on the resist pattern by plating, the contact area between the conductor embedded in the nonresist section and the support can be increased, and the adhesiveness of bumps, metal posts, and the like to the support can be improved. The components (F) may be used singly or in combination of two or more kinds thereof.

Examples of the alkali metal salt (F) include an alkali metal salt represented by the following formula (f1).

$$(W^+)_n X^{n-} \tag{f1}$$

(in which $W^+$ represents an alkali metal ion; $X^{n-}$ represents a monovalent or polyvalent counter anion; and n represents an integer of 1 or more).

In the formula (f1), $W^+$ is not particularly limited as long as it is an alkali metal ion. As the alkali metal ion, a lithium ion, a sodium ion, a potassium ion, a rubidium ion, and a cesium ion are preferred, and a lithium ion, a sodium ion, and a potassium ion are more preferred.

In the formula (f1), n is an integer of 1 or more, preferably an integer of 1 to 3, and more preferably an integer of 1. In the case where n is 1, the alkali metal salt represented by the formula (f1) can be easily prepared or acquired, and the alkali metal salt represented by the formula (f1) has a good solubility in the chemically amplified positive-type photosensitive resin composition.

In the formula (f1), $X^{n-}$ is a monovalent or polyvalent counter anion. $X^{n-}$ is not particularly limited as long as the desired effect can be obtained by the addition of an alkali metal salt (F) to the chemically amplified positive-type photosensitive resin composition, and is appropriately selected from various anions. As described above, n is preferably an integer from 1 to 3, and more preferably 1. Therefore, $X^{n-}$ is particularly preferably a monovalent anion.

Organic Solvent (S)

When the chemically amplified photosensitive resin composition according to the present invention contains an organic solvent (S), the coatability of the chemically amplified photosensitive resin composition, or the film thickness of the photosensitive resin layer of the thick film formed by using the chemically amplified photosensitive resin composition can be adjusted. The components (S) may be used singly or in combination of two or more kinds thereof.

Specific examples of the component (S) include ketones such as acetone, methyl ethyl ketone, cyclohexanone, methyl isoamyl ketone, and 2-heptanone; polyols and derivatives thereof, such as ethylene glycol, ethylene glycol monoacetate, diethylene glycol, diethylene glycol monoacetate, propylene glycol, propylene glycol monoacetate, dipropylene glycol, and dipropylene glycol monoacetate and monomethyl ethers, monoethyl ethers, monopropyl ethers, monobutyl ethers, and monophenyl ethers thereof; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate, and 3-methyl-3-methoxybutyl acetate; and aromatic hydrocarbons such as toluene and xylene.

For the purpose that a photosensitive resin layer obtainable by a spin-coating method or the like has a film thickness of 30 μm or more, the content of the organic solvent (S) is an amount such that the solid concentration of the chemically amplified positive-type photosensitive resin composition is 40% by mass to 65% by mass, and preferably an amount such that the solid concentration is 45% by mass to 60% by mass.

Other Components

The chemically amplified positive-type photosensitive resin composition may further contain a polyvinyl resin in order to improve the plasticity of the formed film. Specific examples of the polyvinyl resin include polyvinyl chloride, polystyrene, polyhydroxystyrene, polyvinyl acetate, polyvinylbenzoic acid, polyvinyl methyl ether, polyvinyl ethyl ether, polyvinyl alcohol, polyvinyl pyrrolidone, polyvinyl phenol, and copolymers thereof. The polyvinyl resin is preferably polyvinyl methyl ether in view of a lower glass transition temperature.

The chemically amplified positive-type photosensitive resin composition may further contain an adhesion aid in order to improve the adhesiveness to the support.

The chemically amplified positive-type photosensitive resin composition may further contain a surfactant for improving coating characteristics, defoaming characteristics, leveling characteristics, and the like. Specific examples of the surfactant include commercially available fluorochemical surfactants such as BM-1000 and BM-1100 (both manufactured by B.M-Chemie Co., Ltd.), Megafac F142D, Megafac F172, Megafac F173, and Megafac F183 (all manufactured by Dainippon Ink And Chemicals, Incorporated), Flolade FC-135, Flolade FC-170C, Flolade FC-430, and Flolade FC-431 (all manufactured by Sumitomo 3M Ltd.), Surflon S-112, Surflon S-113, Surflon S-131, Surflon S-141, and Surflon S-145 (all manufactured by Asahi Glass Co., Ltd.), SH-28PA, SH-190, SH-193, SZ-6032, and SF-8428 (all manufactured by Toray Silicone Co., Ltd.), but are not limited thereto.

The chemically amplified positive-type photosensitive resin composition may further contain an acid or an acid anhydride in order to finely adjust the solubility in a developing solution.

Specific examples of the acid and the acid anhydride include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; and acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, Himic anhydride, 1,2,3,4-butanetetracarboxylic anhydride, cyclopentanetetracarboxylic dianhydride, phthalic anhydride, pyromellitic anhydride, trimellitic anhydride, benzophenonetetracarboxylic anhydride, ethylene glycol bis anhydrous trimellitate, and glycerin tris anhydrous trimellitate.

Chemically Amplified Negative-Type Photosensitive Resin Composition

The chemically amplified negative-type photosensitive resin composition contains at least a compound (A) represented by the formula (1) and/or represented by the formula (4) (hereinafter also referred to as a "component (A)"), an alkali-soluble resin (hereinafter also referred to as a "component (B2)"), a photoacid generator (C), a crosslinking agent (hereinafter also referred to as a "component (G)"), an organic solvent (S), in which the solid concentration is 40% by mass to 65% by mass. The chemically amplified negative-type photosensitive resin composition is alkali-soluble before exposure, but if acids are generated from the component (C) by exposure, a crosslinking reaction occurs between the component (B1) and the component (G) by the action of the acids, and the chemically amplified negative-type photosensitive resin composition is changed to be alkali-insoluble. As a result, in the production of a resist pattern, if a photosensitive resin layer obtained by coating the chemically amplified negative-type photosensitive resin composition on a substrate is selectively exposed, an exposed area is changed to be alkali-insoluble, while an unexposed area is not changed and is still alkali-soluble, and therefore, alkali development can be performed.

Compound (A) Represented by Formula (1) and/or Represented by Formula (4)

As the compound (A) represented by the formula (1) and/or represented by the formula (4), those exemplified as the chemically amplified positive-type photosensitive resin composition can be used.

The content of the component (A) is preferably in the range of 0.01 part by mass to 0.2 part by mass, and more preferably in the range of 0.02 part by mass to 0.1 part by mass, with respect to 100 parts by mass of the resin solid content (in particular, referring to the component (B2) as described later). Alternatively, the content of the component (A) is preferably 0.010% by mass to 0.15% by mass, and more preferably 0.015% by mass to 0.10% by mass, with respect to the total mass of the chemically amplified negative-type photosensitive resin composition, whereby deterioration of the photographic characteristics of the chemically amplified negative-type photosensitive resin composition over time can be effectively suppressed.

Alkali-Soluble Resin (B2)

The alkali-soluble resin (B2) can be selected from various resins blended in the photosensitive resin composition in the related art. The components (B2) may be used singly or in combination of two or more kinds thereof. Examples of the component (B2) include those exemplified as the component (D) in the chemically amplified positive-type photosensitive resin composition, that is, a novolak resin, a polyhydroxystyrene resin, and an acrylic resin.

The content of the component (B2) is preferably in the range of 5% by mass to 60% by mass, with respect to the total mass of the chemically amplified negative-type photosensitive resin composition.

Photoacid Generator (C)

As the photoacid generator (C), those exemplified in the chemically amplified positive-type photosensitive resin composition can be used.

The content of the component (C) is not particularly limited as long as the purpose of the present invention is not impaired. The content is preferably 0.1% by mass to 10% by mass, and more preferably 0.5% by mass to 3% by mass, with respect to the total mass of the chemically amplified negative-type photosensitive resin composition.

Acid Diffusion Control Agent (E)

The chemically amplified negative-type photosensitive resin composition may further contain an acid diffusion control agent (E), as in the chemically amplified positive-type photosensitive resin composition. As the components (E), those exemplified in the chemically amplified positive-type photosensitive resin composition may be used, and specific examples thereof include a nitrogen-containing compound (E1), and an organic carboxylic acid, or an oxo acid of phosphorus or a derivative thereof (E2).

The nitrogen-containing compound (E1) may be used in an amount preferably in the range of 0 parts by mass to 5 parts by mass, and particularly preferably in the range of 0 parts by mass to 3 parts by mass, with respect to 100 parts by mass of the component (B2). The organic carboxylic acid, or the oxo acid of phosphorus or the derivative thereof (E2) may be used in an amount preferably in the range of 0 parts by mass to 5 parts by mass, and particularly preferably in the range of 0 parts by mass to 3 parts by mass, with respect to 100 parts by mass of the component (B2). Further, in order to form a salt for stabilization, the organic carboxylic acid, or the oxo acid of phosphorus or the derivative thereof (E2) is used preferably in an amount equivalent to that of the nitrogen-containing compound (E1).

Crosslinking Agent (G)

The crosslinking agent (G) is crosslinked with the component (B2) under the action of an acid generated from the component (C). The components (G) may be used singly or in combination of two or more kinds thereof. The component (G) is not particularly limited, but for example, a compound having at least two alkyl etherified amino groups in the molecule can be used. Examples of such a compound include nitrogen-containing compounds, in which active methylol groups are partially or entirely alkyl etherified, such as (poly)methylol melamine, (poly)methylol glycoluril, (poly)methylol benzoguanamine, and (poly)methylol urea. Examples of the alkyl group include a methyl group, an ethyl group, a butyl group, and a combination of two or more kinds thereof, and may contain an oligomer component formed by partial self-condensation. Specific examples thereof include hexamethoxymethylated melamine, hexabutoxymethylated melamine, tetramethoxymethylated glycoluril, tetrabutoxymethylated glycoluril.

The content of the component (G) is preferably 5 parts by mass to 50 parts by mass, and more preferably 10 parts by mass to 30 parts by mass, with respect to 100 parts by mass of the component (B2). Within the above range, the favorable curability and patterning characteristics of the chemically amplified negative-type photosensitive resin composition can be easily obtained.

Organic Solvent (S)

Examples of the organic solvent (S) include those exemplified in the chemically amplified positive-type photosensitive resin composition.

For the purpose that a photosensitive resin layer obtainable by a spin-coating method or the like has a film thickness of 30 μm or more, the content of the component (S) is an amount such that the solid concentration of the chemically amplified negative-type photosensitive resin composition is 40% by mass to 65% by mass, and preferably an amount such that the solid concentration is 45% by mass to 60% by mass.

Other Components

The chemically amplified negative-type photosensitive resin composition may further contain other components, as in the chemically amplified positive-type photosensitive resin. Examples of such other components include those exemplified in the chemically amplified positive-type photosensitive resin composition.

Method for Preparing Chemically Amplified Photosensitive Resin Composition

The chemically amplified photosensitive resin composition according to the present invention may be prepared by only mixing and stirring each of the aforementioned components by a conventional method. Each of the aforementioned components may be dispersed and mixed using dispersion equipment such as a dissolver, a homogenizer, or a three-roll mill, if necessary. Thereafter, the mixture may further be filtrated using a mesh, a membrane filter, or the like.

Method for Producing Resist Pattern

The method for producing a resist pattern according to the present invention includes a photosensitive resin layer-forming step of forming a photosensitive resin layer containing the chemically amplified photosensitive resin composition according to the present invention on a substrate, an exposure step of selectively exposing the photosensitive resin layer, and a developing step of developing the exposed photosensitive resin layer.

The substrate is not particularly limited, and substrates known in the related art can be used. Examples thereof include substrates for electronic parts, including the substrates having prescribed wiring patterns formed thereon. Examples of the substrate include substrates made of metals such as silicon, silicon nitride, titanium, tantalum, palladium, titanium-tungsten, copper, chromium, iron, and aluminum; and glass substrates. As the material used for the wiring patterns, copper, solder, chromium, aluminum, nickel, gold, or the like is used.

First, in the photosensitive resin layer-forming step, the chemically amplified photosensitive resin composition according to the present invention is coated on a substrate, and the solvent is removed by heating (prebaking), thereby forming a photosensitive resin layer. As a method for coating the solution on a substrate, a method such as a spin-coating method, a slit-coating method, a roll-coating method, a screen-printing method, and an applicator method may be employed.

The prebaking conditions may vary depending on the composition of the chemically amplified photosensitive resin composition according to the present invention, the film thickness of the photosensitive resin layer, or the like, but the conditions are usually 70° C. to 150° C., and preferably 80° C. to 140° C., for about 2 minutes to 60 minutes.

The film thickness of the photosensitive resin layer is preferably 30 μm or more, and more preferably 45 μm to 70 μm.

Then, in the exposure step, the obtained photosensitive resin layer is selectively irradiated (exposed) with an electromagnetic wave or radiation including particle beam, for example, ultraviolet radiation having a wavelength of 300 nm to 500 nm, or visible light, through a mask of a predetermined pattern.

Low-pressure mercury vapor lamps, high-pressure mercury vapor lamps, ultrahigh-pressure mercury vapor lamps, metal halide lamps, argon gas lasers, or the like can be used for the radiation source of the radiation. Examples of the radiation include micro waves, infrared rays, visible lights, ultraviolet rays, X-rays, γ-rays, electron beams, proton beams, neutron beams, and ion beams. The irradiation dose of the radiation may vary depending on the composition of the chemically amplified photosensitive resin composition according to the present invention, the film thickness of the photosensitive resin layer, and the like. For example, in the case where an ultrahigh-pressure mercury vapor lamp is used, the dose is 100 mJ/cm$^2$ to 10000 mJ/cm$^2$. Further, the radiation includes a light ray to activate the photoacid generator (C) in order to generate an acid.

After the exposure, diffusion of the acid is promoted through heating by methods known in the related art, followed by changing the alkali solubility of the photosensitive resin layer in this exposed area.

Next, in the development step, for example, a predetermined aqueous alkaline solution is used as a developing solution to dissolve and remove unwanted portions, thereby obtaining a predetermined resist pattern.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene, and 1,5-diazabicyclo[4.3.0]-5-nonane can be used. Also, an aqueous solution prepared by adding an appropriate amount of a water-soluble organic solvent such as methanol and ethanol, or a surfactant to the aqueous solution of the alkali can be used as the developing solution.

The developing time may vary depending on the composition of the chemically amplified photosensitive resin composition according to the present invention, the film thickness of the photosensitive resin layer, or the like. The developing time is usually 1 min to 30 min. The method of the development may be any one of a liquid-filling method, a dipping method, a puddle method, and a spray developing method.

After development, washing with flowing water is carried out for 30 seconds to 90 seconds, and is dried by using an air gun, an oven, or the like.

Connecting terminals such as bumps and metal posts can be formed by embedding a conductor such as a metal, by means of plating or the like, in a nonresist section (an area that has been removed by a developing solution) of the resist pattern obtained as described above. Further, there are no particular limitations on the plating treatment method, and various methods that are conventionally known can be employed. As the plating liquid, liquids for solder plating, copper plating, gold plating, and nickel plating, in particular, are suitably used. Finally, any residual resist pattern is removed by using a stripping solution or the like according to a standard method.

EXAMPLES

Hereinafter, the present invention will be described in more detail with reference to Examples, but the scope of the present invention is not limited to these Examples.

Examples 1 to 4 and Comparative Examples 1 to 3

The components (A) to (E) shown in Table 1 were uniformly dissolved in the organic solvent (S) to prepare a chemically amplified positive-type photosensitive resin composition having a solid concentration of 53% by mass. The numerical values in parentheses in Table 1 represent the blending amount (unit: parts by mass) of the components. Further, the blending amount of the organic solvent (S) is an amount such that the solid concentration of the chemically amplified positive-type photosensitive resin composition be 53% by mass.

TABLE 1

| | Compound (A) | Resin (B) | Resin (D) | Photoacid generator (C) | Acid diffusion control agent (E) | Organic solvent (S) |
|---|---|---|---|---|---|---|
| Example 1 | A-1 (0.04) | B-1 (40) | D-1 (40) D-2 (20) | C-1 (2.0) | E-1 (0.02) | S-1 |
| Example 2 | A-1 (0.08) | B-1 (40) | D-1 (40) D-2 (20) | C-1 (2.0) | E-1 (0.02) | S-1 |
| Example 3 | A-2 (0.09) | B-1 (40) | D-1 (40) D-2 (20) | C-1 (2.0) | E-1 (0.02) | S-1 |
| Example 4 | A-2 (0.18) | B-1 (40) | D-1 (40) D-2 (20) | C-1 (2.0) | E-1 (0.02) | S-1 |
| Comparative Example 1 | — | B-1 (40) | D-1 (40) D-2 (20) | C-1 (2.0) | E-1 (0.02) | S-1 |
| Comparative Example 2 | A-3 (0.04) | B-1 (40) | D-1 (40) D-2 (20) | C-1 (2.0) | E-1 (0.02) | S-1 |
| Comparative Example 3 | A-3 (0.08) | B-1 (40) | D-1 (40) D-2 (20) | C-1 (2.0) | E-1 (0.02) | S-1 |

A-1: Compound represented by the following formula

[Chemical formula 31]

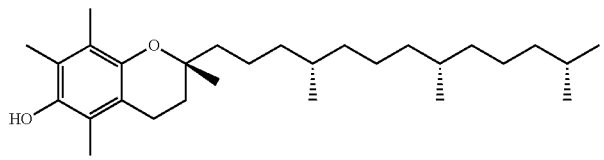

A-2: Compound represented by the following formula

[Chemical formula 32]

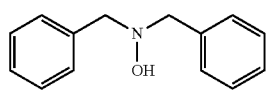

A-3: Compound represented by the following formula

[Chemical formula 33]

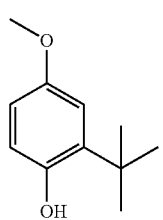

B-1: Acrylic resin represented by the following formula (mass average molecular weight of 100000)

Further, the numerical values included in the respective repeating units in the following formula represent the proportions (mol %) of the respective repeating units with respect to the mole number of all the repeating units contained in the acrylic resin.

[Chemical formula 34]

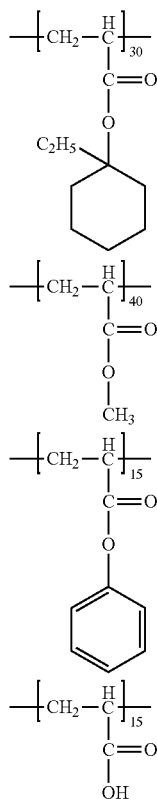

D-1: Polyhydroxystyrene resin (mass average molecular weight of 10000)

D-2: Novolak resin (novolak resin obtained by mixing m-cresol and p-cresol to afford a ratio of m-cresol/p-cresol=60/40 (ratio by mass), followed by addition condensation in the presence of formaldehyde and an acid catalyst) (mass average molecular weight of 8000)

C-1: Compound represented by the following formula

[Chemical formula 35]

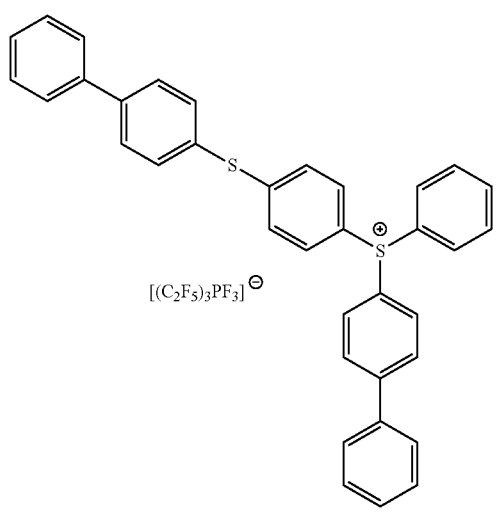

E-1: Tri-n-pentylamine

S-1: Mixed solvent of propylene glycol monomethylether acetate (PM) and 3-methoxybutylacetate (MA) (ratio by mass: 40/60)

Evaluation

Resist Pattern Shape

Immediately after the chemically amplified positive-type photosensitive resin compositions were prepared in Examples or Comparative Examples above, they were coated on a copper substrate using a spin coater, thereby obtaining a photosensitive resin layer having a film thickness of 65 µm. Further, this photosensitive resin layer was prebaked at 150° C. for 5 minutes, and after prebaking, it was subjected to patternwise exposure to line ghi, by using a mask with a predetermined line pattern and an exposing apparatus Prisma GHI (manufactured by Ultratech, Inc.). Subsequently, the substrate was placed on a hot plate and exposed for 3 minutes at 95° C., and then heating (PEB) was carried out. Thereafter, a aqueous 2.38%-by-mass solution of tetramethylammonium hydroxide (TMAH) was added dropwise to the photosensitive resin layer and then the photosensitive resin layer was left to stand for 60 seconds at 23° C. This operation was repeated 4 times in total. Thereafter, the layer was washed with flowing water, and then subjected to nitrogen blowing to obtain a resist pattern having a line pattern of about 40 µm. For this line pattern, the line width was measured and the shape was observed.

On the other hand, the chemically amplified positive-type photosensitive resin compositions prepared in Examples or Comparative Examples above were stored at −20° C., 25° C., or 40° C. for one month, and the same procedure was carried out using the chemically amplified positive-type photosensitive resin compositions after storage, to obtain a resist pattern having a line pattern of about 40 µm. For this line pattern, the line width was measured and the shape was observed.

A difference between the line width of the line pattern obtained with the use of the chemically amplified positive-type photosensitive resin compositions after storage and the line width of the line pattern obtained with the use of the chemically amplified positive-type photosensitive resin compositions immediately after preparation was taken as a CD (Critical Dimension) variation value, and the CD variations were evaluated in accordance to the following criteria. The results are shown in Table 2.

A: The absolute value of the difference in the line width is 0.5 µm or less, and the CD variation over time is very small.

B: The absolute value of the difference in the line width is more than 0.5 µm and 1.0 µm or less, and the CD variation over time is small.

C: The absolute value of the difference in the line width is more than 1.0 µm, and the CD variation over time is large.

In addition, the shape of the line pattern obtained using the chemically amplified positive-type photosensitive resin compositions after storage and the shape of the line pattern obtained using the chemically amplified positive-type photosensitive resin compositions immediate after preparation were compared. Changes in the shapes were evaluated in accordance to the following criteria. The results are shown in Table 2.

A: There is no change in the shape between before and after storage.

B: There are some changes in the shape between before and after storage.

C: There is a significant change in the shape between before and after storage.

TABLE 2

| Storage | CD variation | | | Change in shapes | | |
|---|---|---|---|---|---|---|
| condition | −20° C. | 25° C. | 40° C. | −20° C. | 25° C. | 40° C. |
| Example 1 | A | A | B | A | A | B |
| Example 2 | A | A | B | A | A | B |
| Example 3 | A | A | B | A | A | B |
| Example 4 | A | A | B | A | A | B |
| Comparative Example 1 | A | C | C | A | C | C |
| Comparative Example 2 | A | C | C | A | C | C |
| Comparative Example 3 | A | C | C | A | C | C |

As can be seen from Table 2, in the case of using the compositions in Examples 1 to 4, which contain the compound represented by the formula (1) or the compound represented by the formula (4), there was a small change in the CD variations and the shapes, and the deterioration of photographic characteristics over time was suppressed, after storage at −20° C. as well as storage at 25° C. or 40° C.

To the contrary, in the case of using the compositions in Comparative Examples 1 to 3, which do not contain the compound represented by the formula (1) or the compound represented by the formula (4), there was a small change in the CD variations and the shapes after storage at −20° C., but there was a large change in the CD variations and the shapes and the photographic characteristics over time were deteriorated after storage at 25° C. or 40° C.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A chemically amplified photosensitive resin composition, comprising:
    a compound represented by the following formula (4):

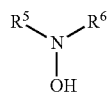
(4)

wherein, $R^5$ and $R^6$ represent a monovalent hydrocarbon group which may have a substituent;
    a resin having an acid-dissociative dissolution-controlling group and whose solubility in alkali increases under the action of an acid;
    a photoacid generator; and
    an organic solvent,
    wherein a solid concentration is 40% by mass to 65% by mass.

2. The chemically amplified photosensitive resin composition according to claim 1, which contains a resin having an acid-dissociative dissolution-controlling group and whose solubility in alkali increases under the action of an acid and an alkali-soluble resin.

3. A method for producing a resist pattern, comprising:
    forming a photosensitive resin layer containing the chemically amplified photosensitive resin composition according to claim 1 on a substrate;
    selectively exposing the photosensitive resin layer; and
    developing the exposed photosensitive resin layer.

4. A method for producing a resist pattern, comprising:
    forming a photosensitive resin layer containing the chemically amplified photosensitive resin composition according to claim 2 on a substrate;
    selectively exposing the photosensitive resin layer; and
    developing the exposed photosensitive resin layer.

5. The method for producing a resist pattern according to claim 3, wherein a film thickness of the photosensitive resin layer is 30 μm or more.

6. The method for producing a resist pattern according to claim 4, wherein a film thickness of the photosensitive resin layer is 30 μm or more.

7. A chemically amplified photosensitive resin composition, comprising:
    a compound represented by the following formula (4);
    wherein,

(4)

wherein, $R^5$ and $R^6$ represent a monovalent hydrocarbon group which may have a substituent,
    a resin having an acid-dissociative dissolution-controlling group and whose solubility in alkali increases under the action of an acid or an alkali-soluble resin;
    a photoacid generator; and
    an organic solvent,
    wherein the content of the compound represented by the formula (4) is in the range of 0.01 part by mass to 0.2 part by mass with respect to 100 parts by mass of the resin solid content, and a solid concentration is 40% by mass to 65% by mass.

* * * * *